(12) United States Patent
Vanhall

(10) Patent No.: US 10,128,870 B2
(45) Date of Patent: Nov. 13, 2018

(54) METHODS AND SYSTEMS FOR MAXIMIZING READ PERFORMANCE OF ERROR DETECTION CODE

(71) Applicant: LOCKHEED MARTIN CORPORATION, Bethesda, MD (US)

(72) Inventor: Richard C. Vanhall, Owego, NY (US)

(73) Assignee: LOCKHEED MARTIN CORPORATION, Bethesda, MD (US)

(*) Notice: Subject to any disclaimer, the term of this patent is extended or adjusted under 35 U.S.C. 154(b) by 2 days.

(21) Appl. No.: 15/147,345

(22) Filed: May 5, 2016

(65) Prior Publication Data

US 2016/0357466 A1    Dec. 8, 2016

Related U.S. Application Data

(60) Provisional application No. 62/160,286, filed on May 12, 2015.

(51) Int. Cl.
| | |
|---|---|
| G06F 11/08 | (2006.01) |
| H03M 13/00 | (2006.01) |
| H03M 13/15 | (2006.01) |
| H03M 13/01 | (2006.01) |
| H03M 13/37 | (2006.01) |

(52) U.S. Cl.
CPC ......... *H03M 13/1515* (2013.01); *G06F 11/08* (2013.01); *H03M 13/015* (2013.01); *H03M 13/373* (2013.01); *H03M 13/3715* (2013.01); *H03M 13/3738* (2013.01)

(58) Field of Classification Search
None
See application file for complete search history.

(56) References Cited

U.S. PATENT DOCUMENTS

| | | | |
|---|---|---|---|
| 7,444,582 B1 | 10/2008 | Au et al. | |
| 7,900,125 B1 * | 3/2011 | Liu | G06F 11/1048 714/760 |
| 8,132,082 B2 | 3/2012 | Au et al. | |
| 8,296,635 B2 | 10/2012 | Au et al. | |
| 8,788,916 B2 | 7/2014 | Au et al. | |
| 2005/0283715 A1 * | 12/2005 | Sutivong | H04L 1/0045 714/790 |
| 2015/0244500 A1 * | 8/2015 | Muller | H04L 1/0054 375/222 |

OTHER PUBLICATIONS

I. Sofair., "IEEE—Probability of Miscorrection for Reed-Solomon Codes" Naval Surface Warfare Center, Dahlgren, Virginia, Year: 2000, pp. 398-401.
European Search Report dated Dec. 20, 2016 in related EP Application No. 16169140, 9 pages.
(Continued)

*Primary Examiner* — Mujtaba M Chaudry
(74) *Attorney, Agent, or Firm* — Kent Kemeny; Andrew M. Calderon; Roberts Mlotkowski Safran Cole & Calderon, P.C.

(57) ABSTRACT

Systems and methods for maximizing read performance of error detection code are provided. More particularly, systems and methods for maximizing read performance of Reed Solomon Based code are provided.

14 Claims, 28 Drawing Sheets

(56) References Cited

OTHER PUBLICATIONS

ISO/IEC 18004 "Information Technology—Automatic Identification and data capture techniques QR code 2005 bar code symbology specification". Second Edition Publish Sep. 1, 2006. 122 pages.
ISO/IEC 16022:2000 Information technology—International symbology specification—Data matrix, Publish May 15, 2004, 100 pages.
Boutillon et al, "Architecture for a Smart Reed-Solomon Decoder", Departement COMELEC Ecole Nationale Superieure des Telecommunications (ENST), 1999 IEEE. 4 pages.
Australian Search Report dated May 8, 2017 in related AU Application No. 2016203021, 4 pages.

\* cited by examiner

FIG. 3A

DataMatrix Status
False Positives
*Misread modeling for DM 14x14*
*Limit FPs by Relative Correction Cost Limit*

Absolute Correction Cost Limit

A better approach than an absolute limit would be to change the Maximum Correction Cost depending on the reported number of errors value.

Relative Correction Cost Limit

| Reported Number Of Errors | Maximum Correction Cost |
|---|---|
| 0 | 5 |
| 1 | 7 |
| 2 | 7 |
| 3 | 9 |
| 4 | 10 |
| 5 | 10 |

DataMatrix Status
False Positives
Common Mitigation Data Collection

| Reported Number Of Erasures | Reported Number Of Errors | | | | | |
|---|---|---|---|---|---|---|
| | 0 | 1 | 2 | 3 | 4 | 5 |
| 0 | 0 | 0 | 0 | 0 | 0 | 0 |
| 1 | 0 | 0 | 0 | 0 | 0 | 0 |
| 2 | 0 | 0 | 0 | 0 | 0 | |
| 3 | 0 | 0 | 0 | 0 | | |
| 4 | 0 | 8 | 0 | 2 | 3 | |
| 5 | 0 | 10 | 37 | 0 | | |
| 6 | 0 | 1117 | 51 | 149 | | |
| 7 | 75 | 1020 | 6736 | | | |
| 8 | 87 | 233855 | | | | |
| 9 | 19541 | | | | | |
| 10 | 19569 | | | | | |
| 11 | 5000000 | | | | | |

False Positives for RS(192,136), DM 104 x 104

FIG. 7D

METHODS AND SYSTEMS FOR MAXIMIZING READ PERFORMANCE OF ERROR DETECTION CODE

FIELD OF THE INVENTION

The invention is directed to systems and methods for maximizing read performance of error detection code. More particularly, the invention is directed to systems and methods for maximizing read performance of Reed Solomon Based code.

BACKGROUND DESCRIPTION

Many different error detection and compensation processes have been developed to read damaged barcodes or, generally speaking, encoded messages. For example, Reed Solomon Error Correction can be used with several different technologies including reading of damaged barcodes, as well as QR-Codes or other decode implementations such as, for example, consumer electronics, data transmission technologies and computer applications, amongst others.

By way of an illustrative example, barcodes can be scanned by optical scanners called barcode readers. These optical scanners can be a handheld device, e.g., portable digital assistants, stationary devices or other computing devices. In any scenario, the barcode reader is designed to read and decode the barcode. However, decoding of barcodes is a complicated process, particularly when the barcode is damaged or obscured in some manner. For example, the barcode reader can have difficulty decoding the barcode due to it being partially obscured within a window of an envelope, cut off or damaged, amongst a host of other conceivable issues.

In an attempt to compensate for such issues, many different error detection and compensation processes have been developed. Illustratively, a widely used process is the Reed-Solomon approach. The Reed-Solomon approach is a systematic way of building codes that could detect and correct multiple random symbol errors. Although this is a very effective approach, codes that are based on Reed Solomon Error Correction are susceptible to False Positives when decoding is too aggressive at using the correction capacity or False Negatives when decoding is too conservative. To compensate for such, existing solutions use a single threshold to control both of these situations, which is optimal for neither.

SUMMARY OF THE INVENTION

In an aspect of the invention, the methods described herein are implemented in a computing device. That is, maximizing read performance of Reed Solomon Based code as described herein are implemented in a computing device.

In yet another aspect of the invention, a computer program product for maximizing read performance of Reed Solomon based code comprises a computer usable storage medium program code embodied in a storage medium. The program code is readable/executable by a computing device to perform the methods described herein. More specifically, the computer system the processor executes the program instructions and causes the computer system to dynamically determine multiple thresholds for cases of erasures and errors in the Reed Solomon based code using a relative correction cost limit.

In still yet another aspect of the invention, a system comprises a CPU, a computer readable memory and a computer readable storage medium. The system further comprises program instructions to perform the methods described herein including maximizing read performance of Reed Solomon Based code in view of the following description. The program instructions are stored on the computer readable storage.

In further aspects of the invention, a computer program product comprises computer readable program instructions stored on computer readable storage medium. The computer readable program instructions cause a computing device to provide dynamically adjustable thresholds for cases of erasures and errors in the Reed Solomon based code based on a number of examples of actual data for each error/erasure combinations.

BRIEF DESCRIPTION OF THE DRAWINGS

The invention is described in the detailed description which follows, in reference to the noted plurality of drawings by way of non-limiting examples of exemplary embodiments of the present invention, in which like reference numerals represent similar parts throughout the several views of the drawings, and wherein:

FIGS. 3A-3F show collected Reed Solomon correction information without an absolute limit in accordance with aspects of the invention, with FIG. 3A showing a comparison of a conventional system and method vs. the systems and methods of the present invention.

FIGS. 7A-7D show matrices representing a number of False Positives based on a reported number of erasures and errors, in accordance with aspects of the invention.

DETAILED DESCRIPTION OF EMBODIMENTS OF THE INVENTION

Figure 1A:
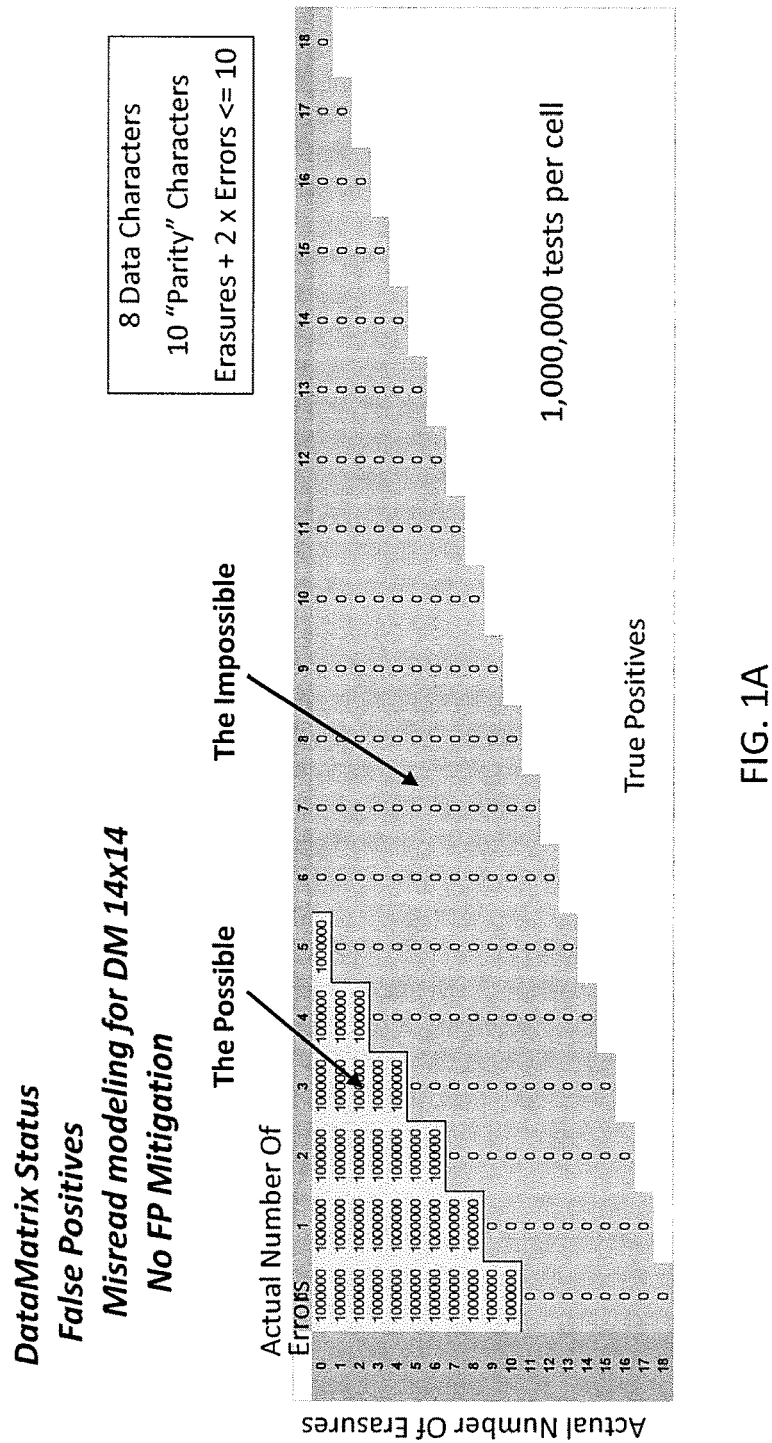
FIGS. 1A-1E show collected Reed Solomon correction information up to a maximum possible threshold, e.g., (2×errors)+erasures≤10.
Figure 1B:
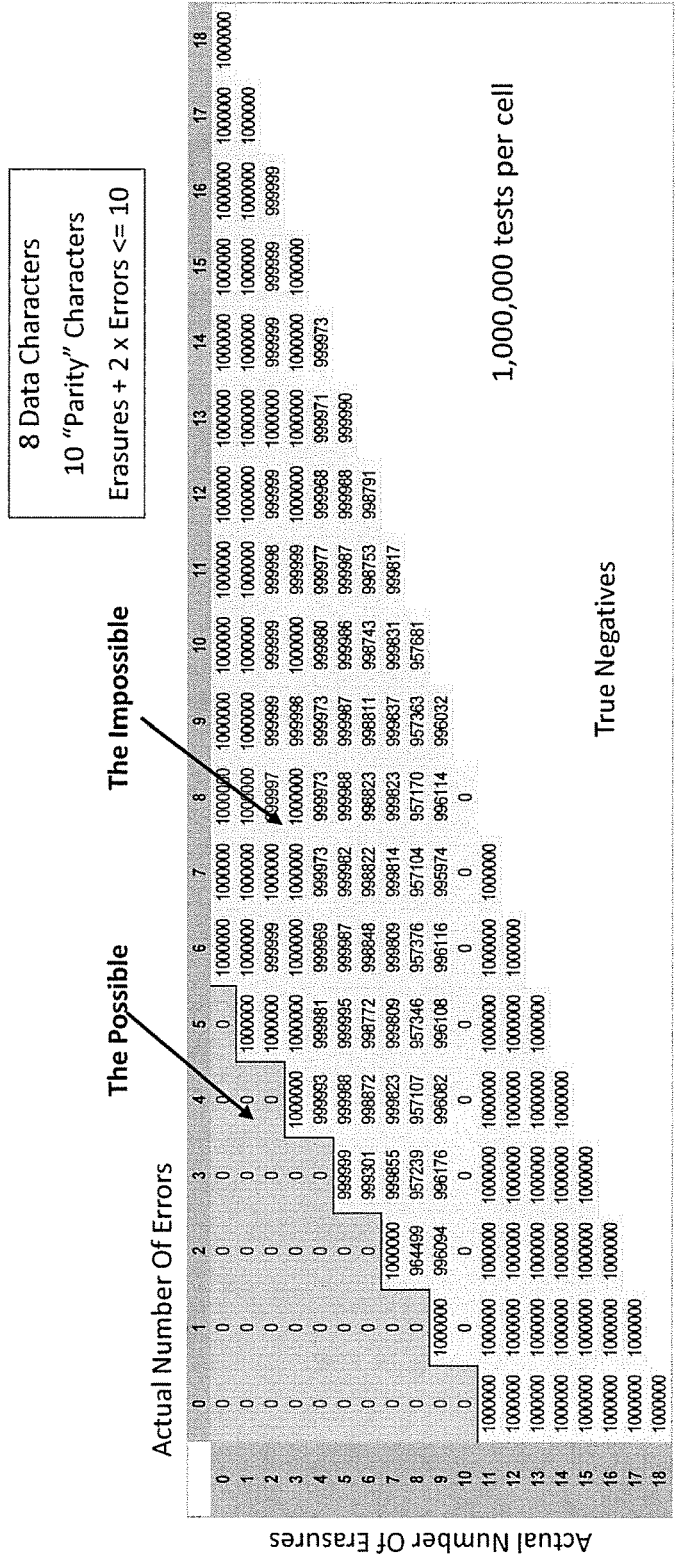
Figure 1C:
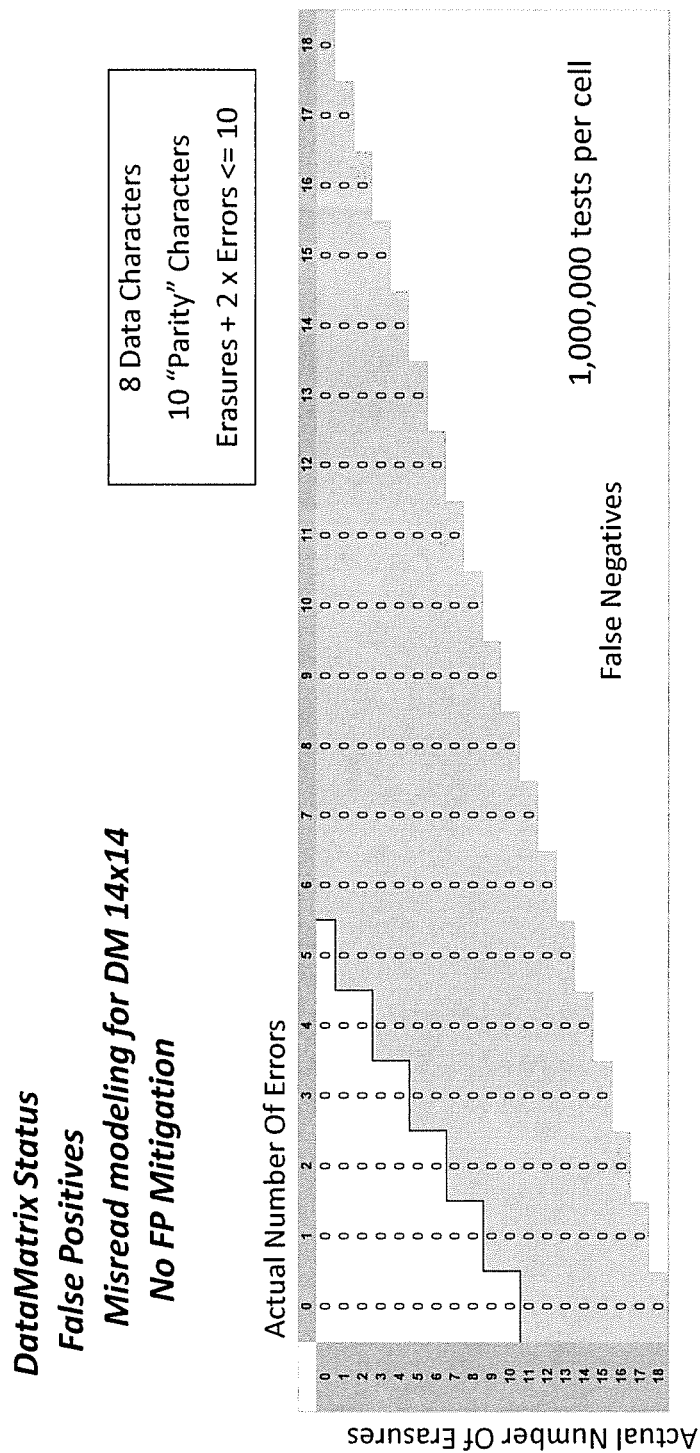

The invention is directed to systems and methods for maximizing read performance of error detection code. More particularly, the systems and methods described herein maximize read performance of Reed Solomon Based code. In even more specific embodiments, the systems and methods described herein reduce the likelihood of False Positive decodes, when decoding is aggressively used, by using thresholds that are dynamically determined in response to the user's request for a maximum False Positive error rate.

In other words, the systems and methods described herein do not use a single threshold, i.e., an absolute value, as in existing solutions to control both situations of False Positives and False Negatives. Note that the user's maximum False Positive error rate is also dynamic, e.g., it may change per barcode if so desired.

In embodiments, the threshold can be based on a reported number of errors and/or erasures. By way of example, instead of using a single threshold for each error/erasure combination as in conventional systems, the methods and systems provided herein use specific data for each error/erasure combination, which indicates the combination's susceptibility to an incorrect decode. That is, the methods and systems of decoding described herein implement dynamically determined thresholds based on a reported number of errors (and/or erasures), which greatly improves the results of False Positives and False Negatives. In at least one implementation of the methods and systems described herein provide, e.g., 25% fewer False Negatives.

In embodiments, an expansion of the threshold per reported number of errors method is to collect actual data for each of the error/erasure combinations and use this information in real time to set a threshold to user requirements. Accordingly, multiple thresholds can be used by the methods and systems described herein, in comparison to an absolute threshold used in conventional systems for multiple error/erasure combinations.

In embodiments, the data, e.g., multiple thresholds, can be created by building examples, e.g., millions of examples, and collecting the actual decoding results. The user can then dynamically decide what their threshold (as a probability of getting an error) should be in such example, thereby reducing the False Positives and False Negatives. Accordingly, in a first solution according to aspects of the invention, instead of one threshold that covers all cases as in a conventional method, each reported number of errors case has an optimized threshold just for each case. In a second solution, each case (row, column) may have an independent threshold, and the underlying data can be used for dynamic decisions, e.g., the user's threshold may change from decision to decision.

The solutions described herein can be applicable to many different applications including, e.g., postal customers that use the data matrix symbology. Specifically, the technology described herein allow more aggressive reading of damaged barcodes while keeping False Positives and False Negatives at acceptable levels. Also, the systems and methods described herein are applicable to QR-Codes as well as any code or messaging system that uses Reed Solomon Error Correction.

Moreover, although the present invention is described with regard to decoding of barcodes, the systems and methods also contemplate other decode implementations such as, for example, applications related to consumer electronics, data transmission technologies and computer applications, amongst other applications. More specifically, the present invention can be implemented in consumer electronics such as CDs, DVDs, Blu-ray Discs, in data transmission technologies such as DSL and WiMAX, in broadcast systems such as DVB and ATSC, and in computer applications such as RAID 6 systems.

By way of further explanation, Reed Solomon is a block-based error correcting code, which uses polynomials over Galois fields. In Reed Solomon, RS (n,k), where:
n is a number of symbols in message;
k is a number of data symbols in message; and
n-k is a number of parity (or check) symbols in a message.

As should be understood by those of skill in the art, errors refer to an incorrect value at an unknown location. In this example, the decoding algorithm determines the location of the error and corrects the error. On the other hand, erasures are an incorrect value or unknown value at a known location. The location is identified to the decoding algorithm which then needs only to correct the error. In embodiments, the decoding algorithm can be implemented in the infrastructure shown in FIG. 10, as an example.

Reed Solomon can (and will) make mistakes when the errors (and/or erasures) exceed the correcting capability of the code. The correction cost is noted as:
CorrectionCost=(2×Errors)+Erasures; and
CorrectionCost<=Number of Parity Symbols.

FIGS. 1A-1E show collected Reed Solomon correction information up to a maximum possible threshold, e.g., (2×errors)+erasures≤10. Accordingly, as shown in FIGS. 1A-1E, an approach to limiting False Positive decodes is to be conservative on the allowable correction cost. It should be understood by those of skill in the art that the threshold of errors is not limited in this example; instead this example is about going beyond the maximum capability of the correction algorithm and seeing the incorrect decodes result.

Figure 1D:
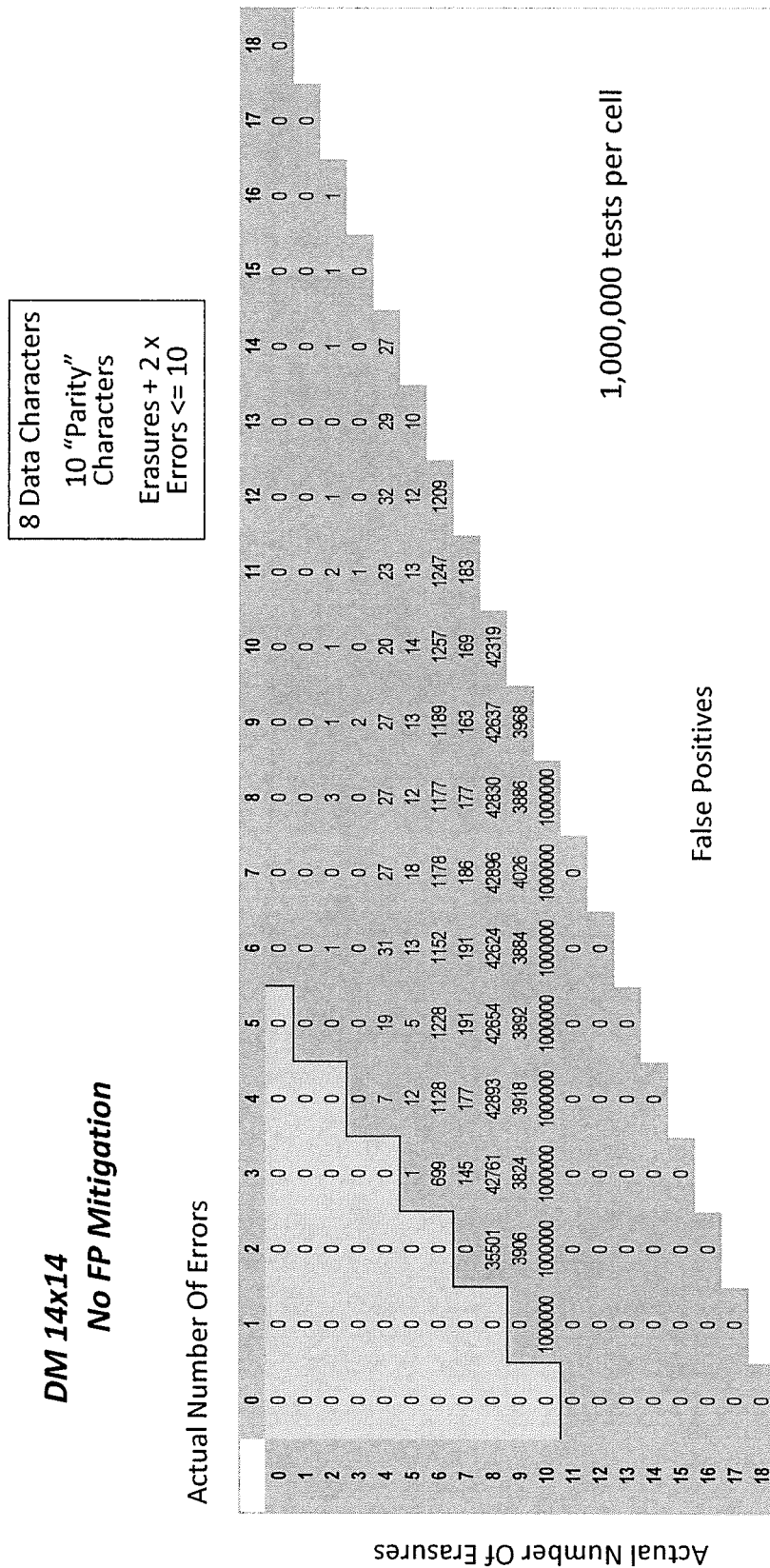
Figure 1E:
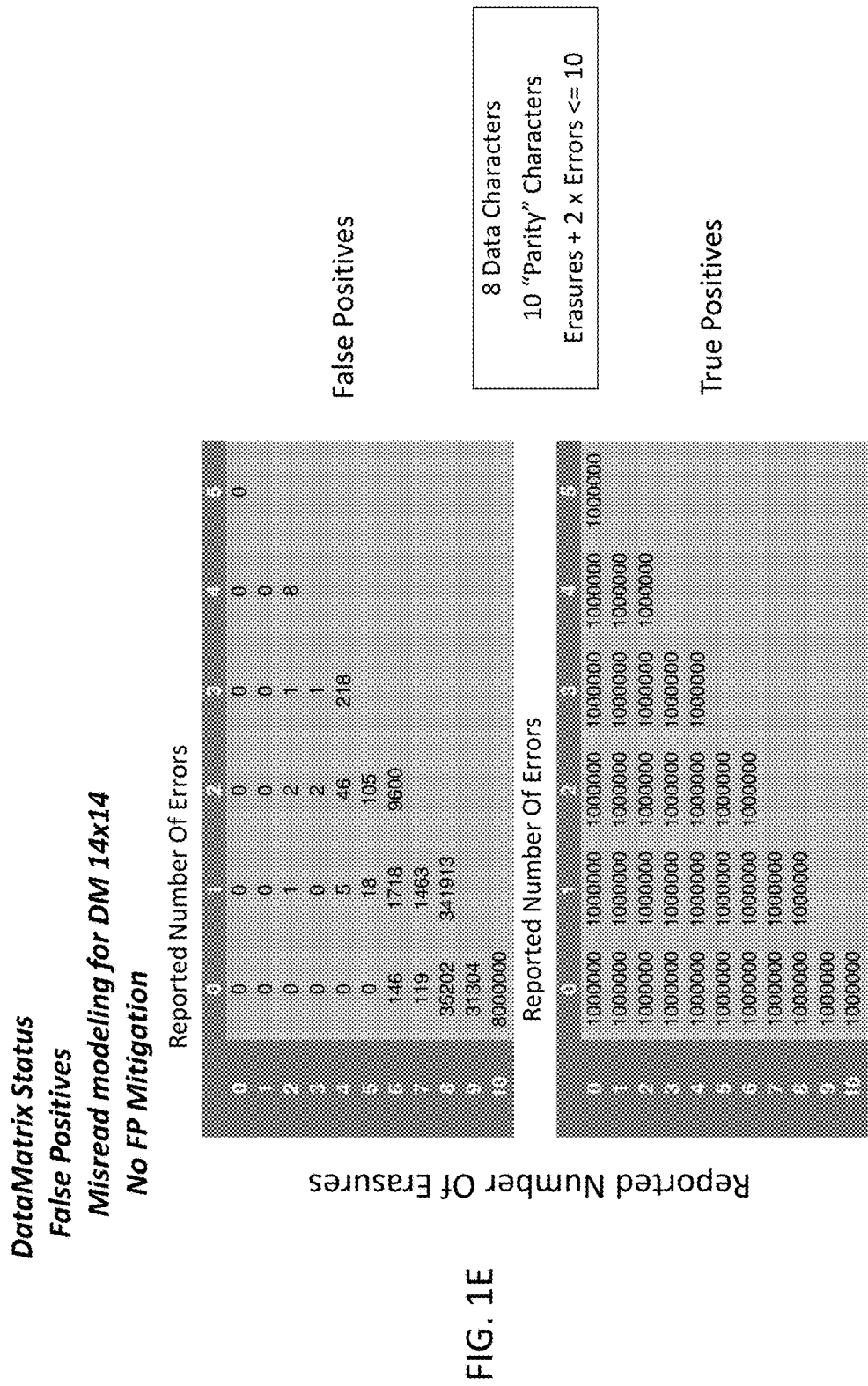

Also, it should be understood by those of skill in the art that FIGS. 1A-1D show actual errors and erasures; whereas FIG. 1E shows reported errors and erasures of the decoder. In the case of FIG. 1E, for example, the reported errors and erasures show fewer than actually present false positives (compared to that which was shown in FIGS. 1A-1D). In other words, reporting is underreported when the correction cost (2*errors+erasures) exceeds the number of parity symbols. Thus, it is shown that for a correction cost that is at or below the number of parity symbols the reporting is acceptable, but once above the number of parity symbols (maximum correction cost), the false positive rate becomes unacceptable, and hence the impetus for the present invention. It should further be understood by those of skill in the art that the notation "possible" shown in a first shaded region is within the capabilities of the decoding algorithm and the notation "impossible" shown in a second shaded region exceeds the capabilities of the decoding algorithm which, in turn, may generate False Positives (which is being addressed by the systems and methods of the present invention).

More specifically, in the example of FIGS. 1A-1E, the data matrix is representative of 1,000,000 tests per cell, in a misread modeling comprising a 14×14 matrix, with no False Positive mitigation (FP Mitigation). It should be understood by those of skill in the art that each of the matrices of FIGS. 1A-1D represent actual number of erasures (y-axis) and actual number of errors (x-axis) over the test sample. In FIG. 1E, the data matrix is representative of a reported number of errors (x-axis) and a reported number of erasures (y-axis).

In the exemplary testing approach of FIGS. 1A-1E, one set of 1,000,000 messages per possible valid combination of erasures and errors can be generated, with the data characters being generated randomly and the parity characters generated using a standard encoding method. The specific quantity of erasures and errors are applied in random positions to the data and parity characters, with each of the 1,000,000 messages decoded. After decoding, the result (if any) can be scored and the test counted as one of four possible outcomes: i.e., true positive (TP) (FIG. 1A), true negative (TN) (FIG. 1B), False Negative (FN) (FIG. 1C), and False Positive (FP) (FIGS. 1D). FIG. 1E is representative of both False Positive and true positive. False Positives Reed Solomon correction information is also collected.

FIGS. 2A-2E show another test which takes the simplest approach to reducing errors by reducing the maximum correction cost from 10 to 7:(2×Errors)+Erasures<=7. This reduction is an attempt to weed out the false positive decodes resulting from codeword that were damaged more than the algorithm can cope with. Similar to FIGS. 1A-1E, the data matrices of FIGS. 2A-2E are representative of 1,000,000 tests per cell, in a misread modeling comprising a 14×14 matrix. In FIGS. 2A-2E, though, the False Positives (FP) are limited by an absolute correction cost limit.

Figure 2A:
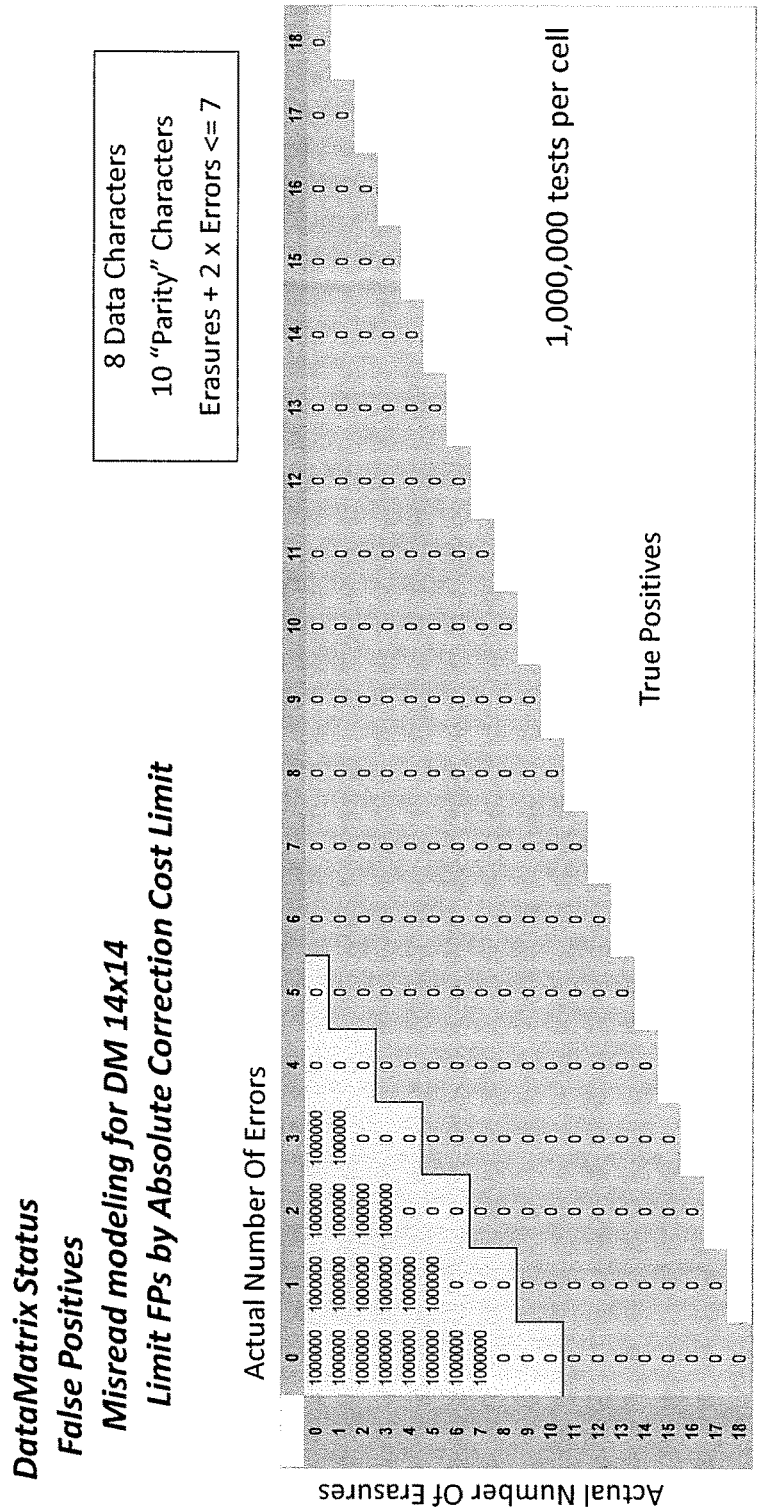
FIGS. 2A-2E show collected Reed Solomon correction information with a lower threshold (simpler approach), e.g., (2×errors)+erasures≤7.
Figure 2B:
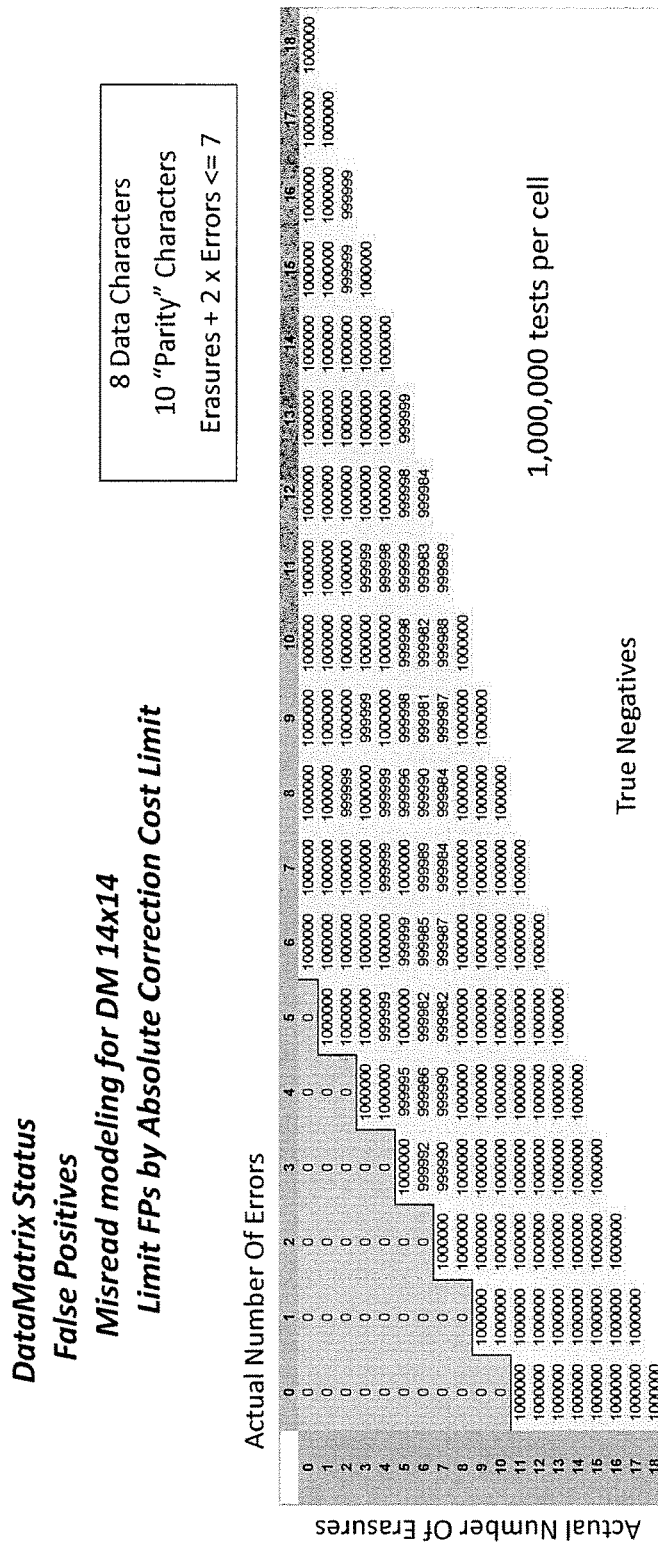
Figure 2C:
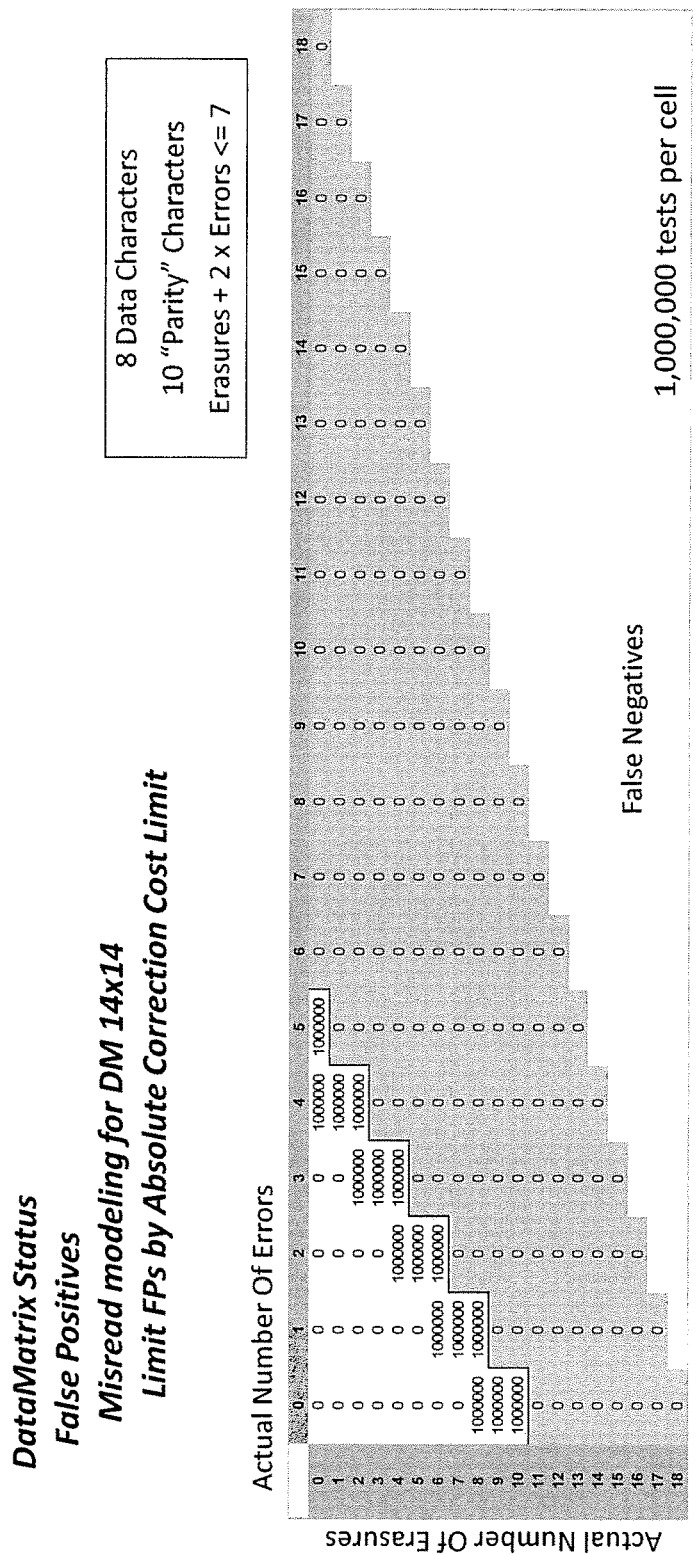
Figure 2D:
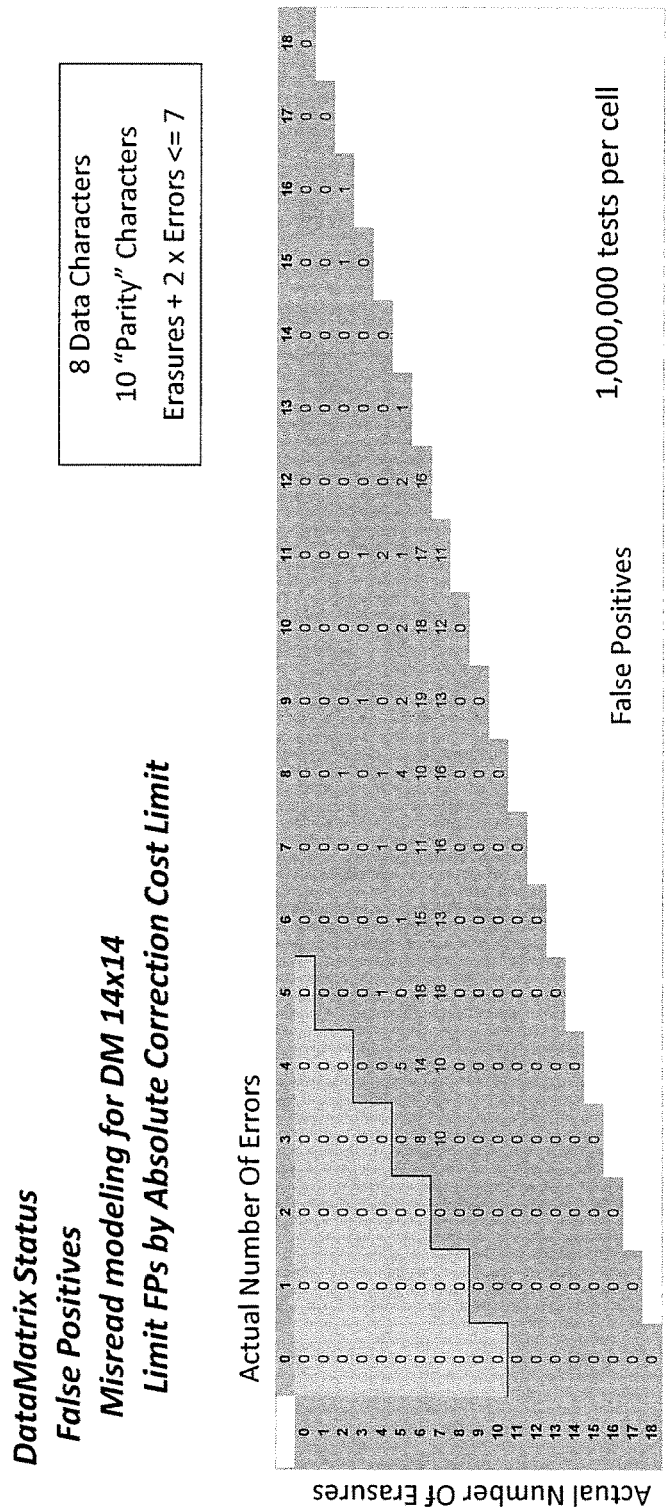
Figure 2E:
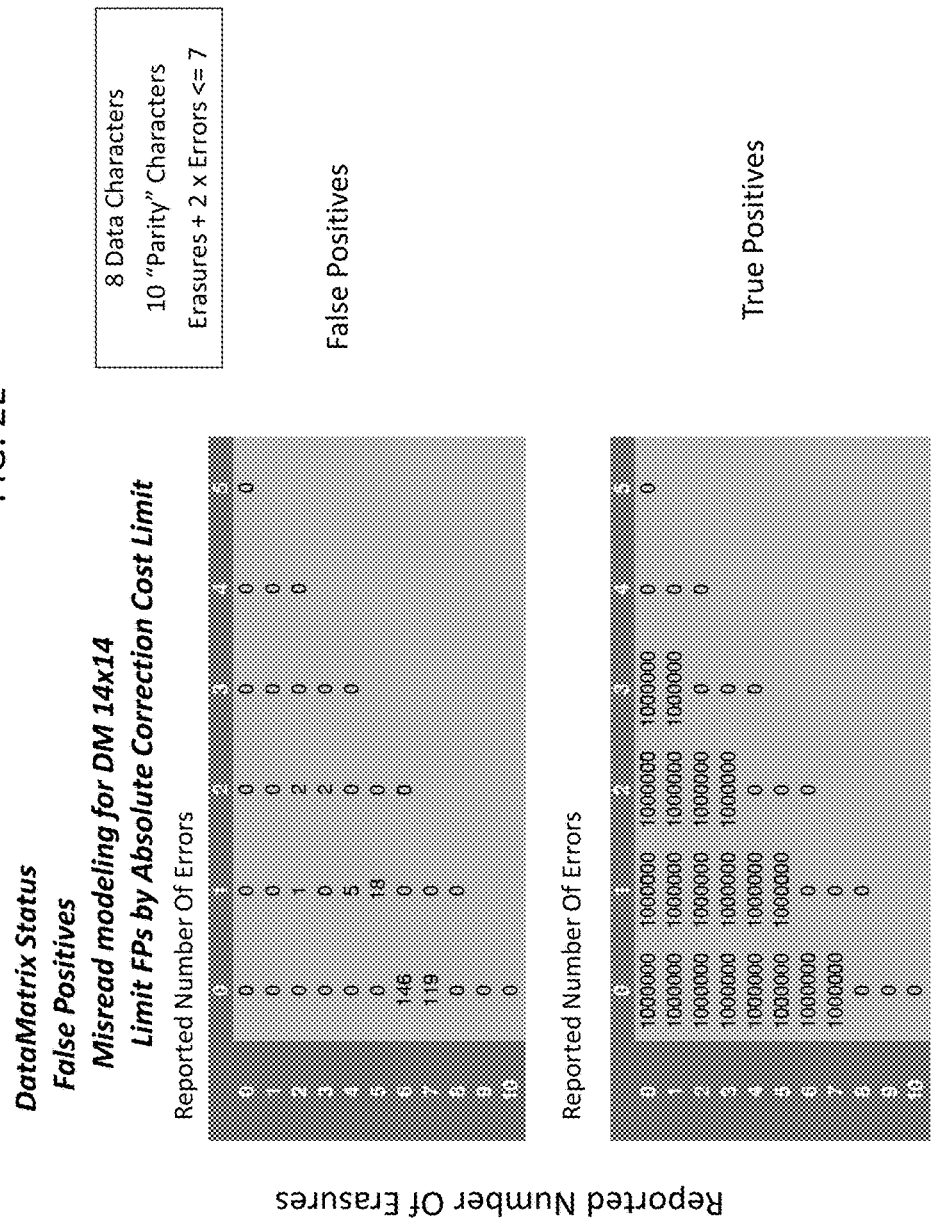

It should be understood by those of skill in the art that each of the matrices of FIGS. 2A-2D represent actual number of erasures (y-axis) and actual number of errors (x-axis) over the test sample. In FIG. 2E, the data matrix is representative of a reported number of errors (x-axis) and a reported number of erasures (x-axis). In the exemplary testing approach of FIGS. 2A-2D, one set of 1,000,000 messages per possible valid combination of erasures and errors can be generated, with the data characters being generated randomly and the parity characters generated using a standard encoding method. The specific quantity of erasures and errors are applied in random positions to the data and parity characters, with each of the 1,000,000 messages decoded. After decoding, the result (if any) can be scored and the test counted as one of four possible outcomes: i.e., TP (true positive), TN (true negative, FN (False Negative), and FP (False Positive). False Positives Reed Solomon correction information is also collected.

Figure 3B:
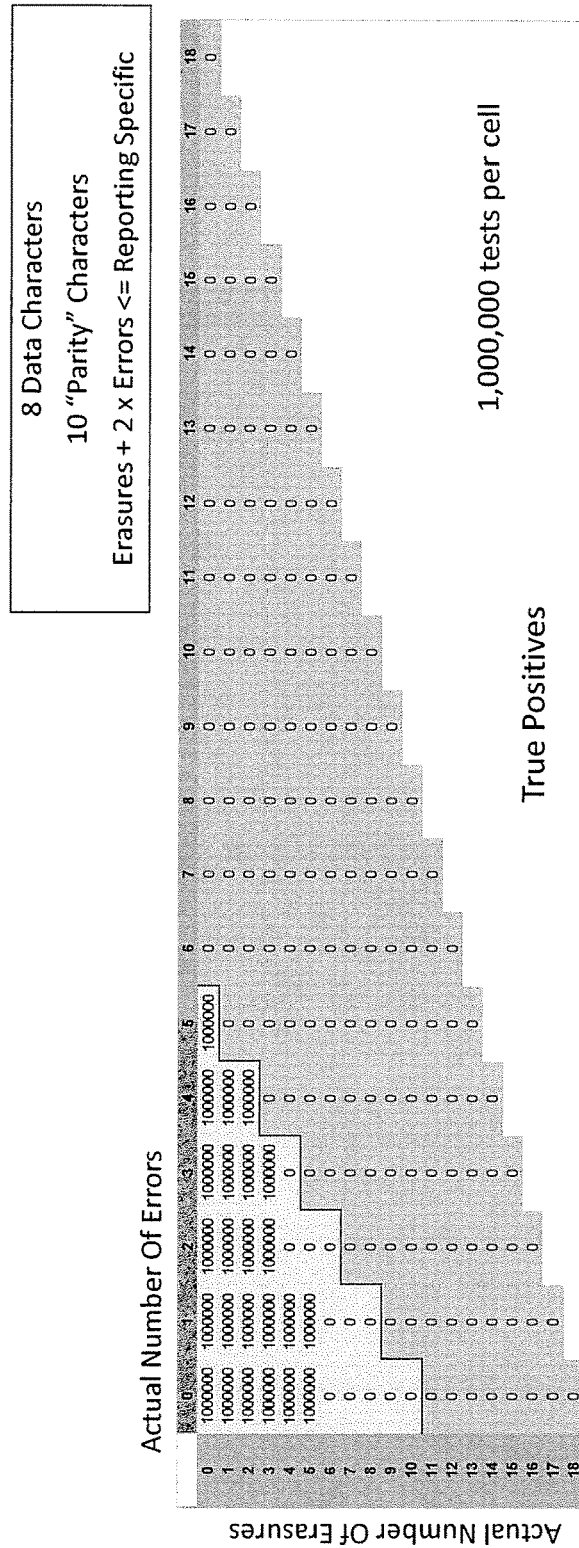

However, as shown by comparison in FIG. 3A, it has been found that a better approach than an absolute limit is to change the maximum correction cost depending on the reported number of errors value. In other words, as shown in FIG. 3A (and FIGS. 3B-3f) the use of a relative correction cost limit provides improved results. For example, implementing the processes and systems described herein, it is possible to have (2×Errors)+Erasures<=N, where N can be any number for a particular matrix (array), column or row. In embodiments, "N" can be based on collected actual data for each of the error/erasure combinations and can be used in real time to meet threshold user requirements. In embodiments, this data can be created by building millions of examples and collecting the actual decoding results. By implementing the processes herein, the user can dynamically decide their threshold for a particular erasure and/or error combination (as a probability of getting an error).

For example, it is now possible to take a more or less aggressive approach (e.g., aggressive vs. conservative) based on an number of errors (e.g., False Positives) and/or erasures, which can be tolerated by the user. Illustratively, as the number of erasures increases, the user can take a more conservative approach by reducing the maximum correction cost from 10 to 2:(2×Errors)+Erasures<=2; whereas, a more aggressive approach can be taken when there are less erasures but the errors are increasing, e.g., by having a maximum correction cost of 10:(2×Errors)+Erasures<=10. In embodiments, 10 should be a theoretical limit. As shown representatively in FIG. 3D, through simulations, it is shown that results of decoding that use different thresholds based on a reported number of errors has good low False Positives and 25% fewer False Negatives, compared to a conventional system using the same data.

To this end, FIGS. 3A-3F show collected Reed Solomon correction information without using an absolute limit in accordance with aspects of the invention, with FIG. 3A showing a comparison of a conventional system and method vs. the systems and methods of the present invention. For comparison purposes, FIG. 3A is representative of a set of 1,000,000 tests per cell, in a misread modeling comprising a 14×14 matrix, with the False Positives (FP) limited by a relative correction cost limit (e.g., matrix at the lower right portion of the figure) vs. an absolute correction cost limit (e.g., matrix at the upper left portion of the figure). As noted in FIG. 3A, for example, the maximum correction cost varies from 5-10, with a reported number of errors of 0-5.

FIGS. 3B-3F also show collected Reed Solomon correction information without an absolute limit in accordance with aspects of the invention. That is, unlike that shown in FIGS. 1A-1E and 2A-2E, FIGS. 3B-3F show an example with False Positives limited by a relative correction cost, e.g., multiple thresholds. FIGS. 3B-3F, for comparison purposes, show a set of 1,000,000 tests per cell, in a misread modeling comprising a 14×14 matrix, with a relative correction cost limit for different matrices, rows and columns. That is, in FIGS. 3B-3F, False Positives are limited by a relative correction cost limits based on the tolerance of the user for a particular number of errors.

Figure 3C:
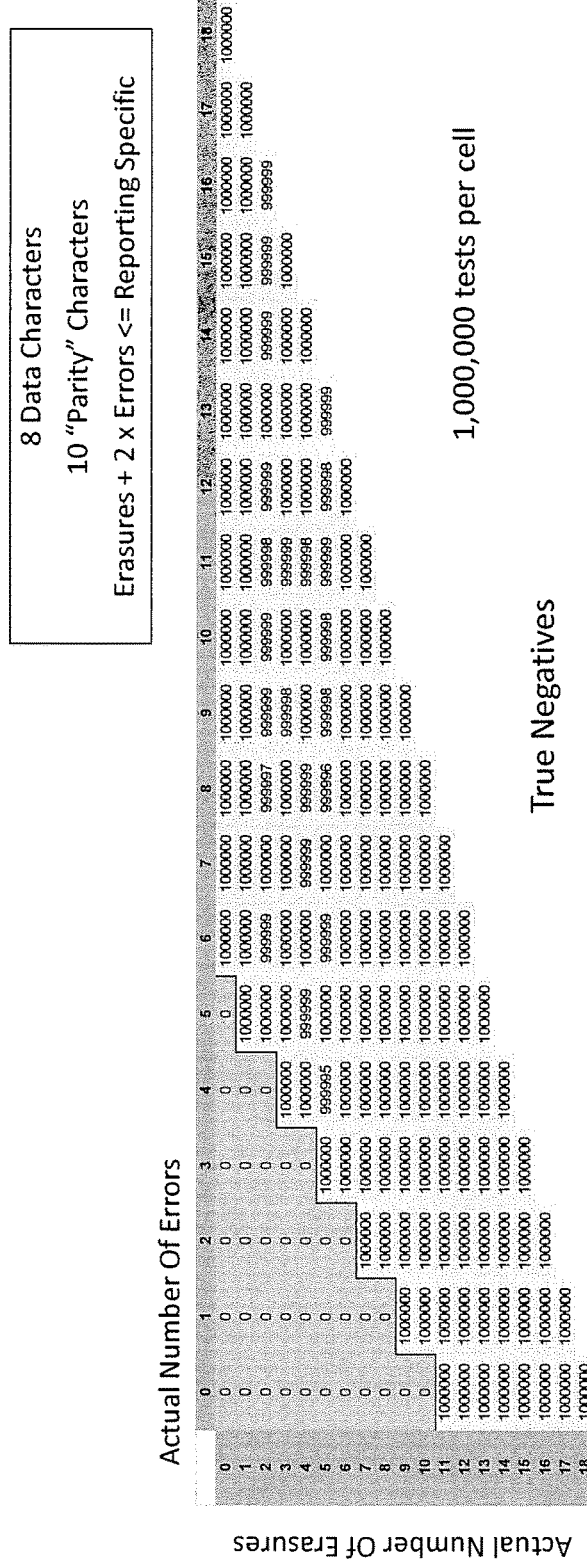
Figure 3D:
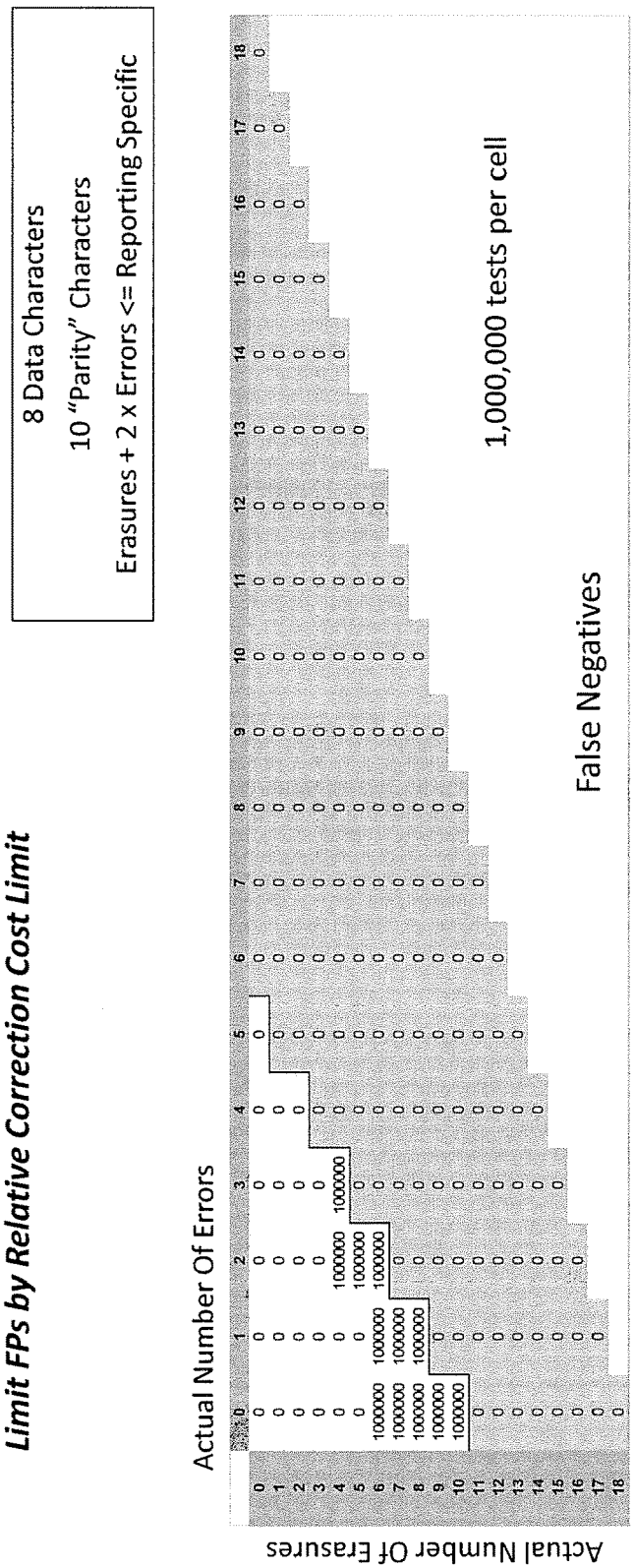
Figure 3E:
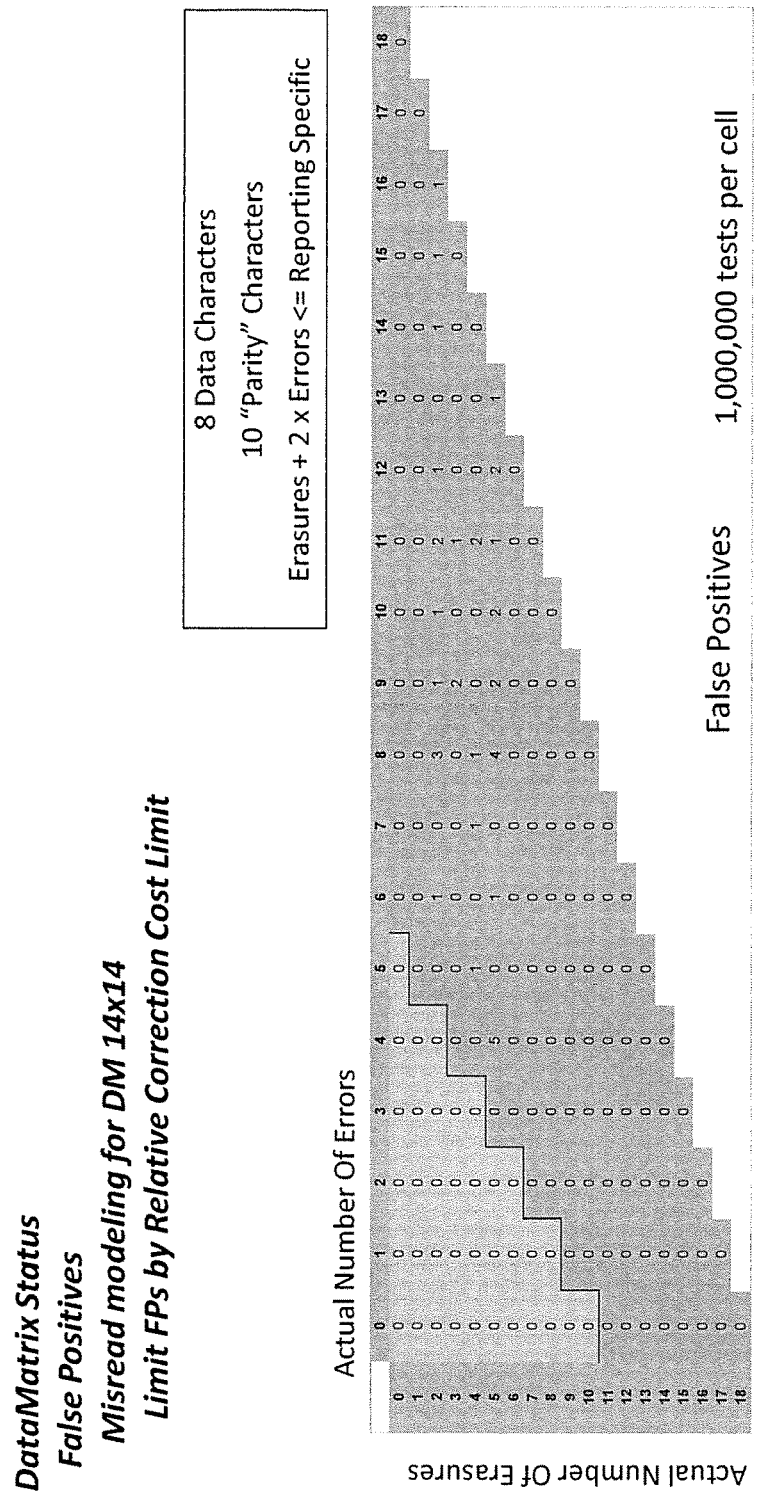
Figure 3F:
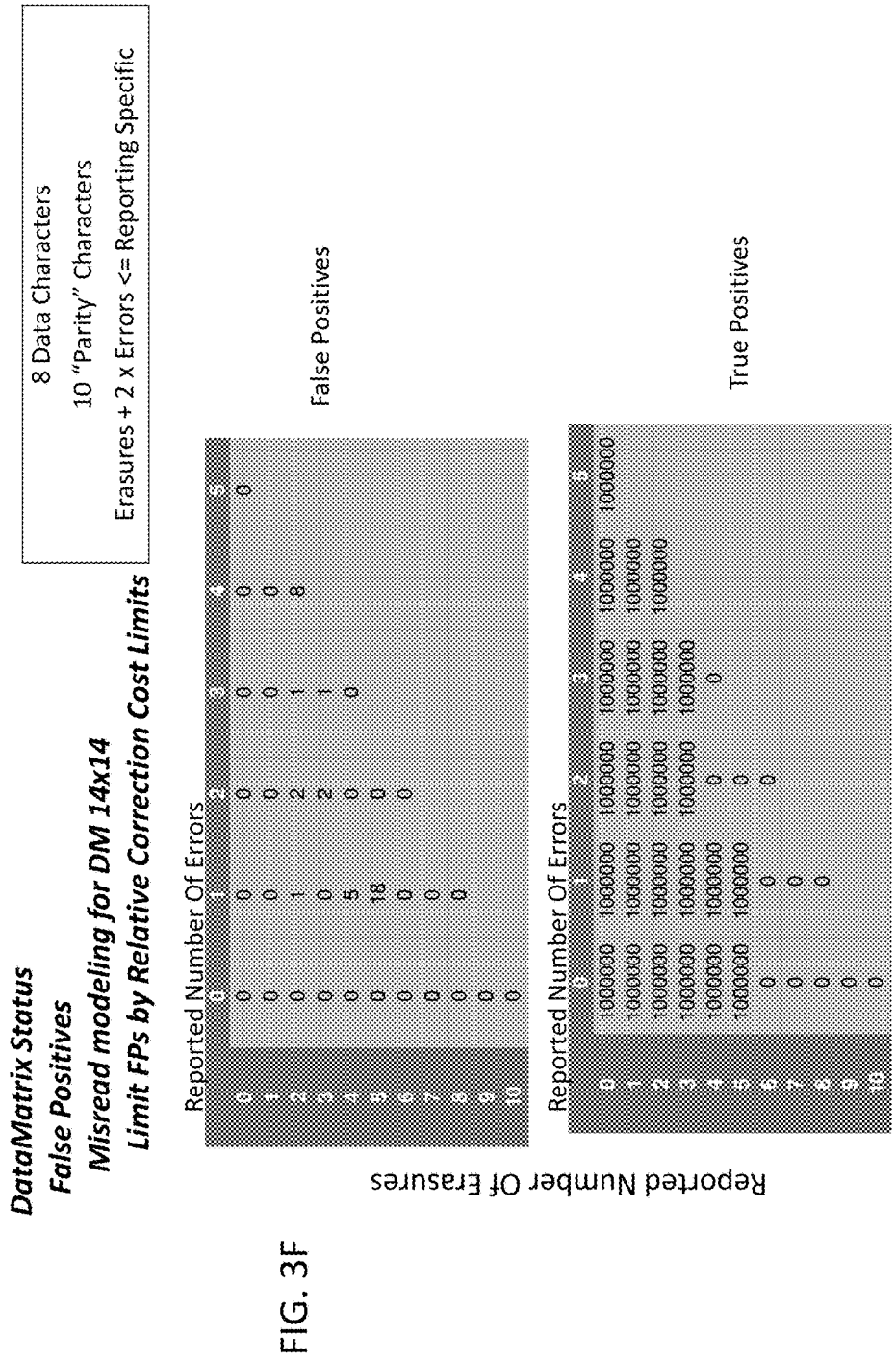

More specifically, FIG. 3B shows a matrix of an actual amount erasures vs. errors with an improvement of true positives. FIG. 3C shows a matrix of an actual amount erasures vs. errors with an improvement of true negatives. FIG. 3D shows a matrix of an actual amount erasures vs. errors with an improvement of False Negatives. FIG. 3E shows a matrix of an actual amount erasures vs. errors with an improvement of False Positives. FIG. 3F shows a reported number of erasures vs. errors, with an improvement shown to both False Positives and true positives as described above, e.g., 25% fewer False Negatives. Accordingly, it should be understood by those of skill in the art that by using the array (matrix) of actual data of False Positives and False Negatives, the user's input, and RS Correction Information (e.g., reported number of erasures and reported number of errors), it is possible to provide an improved result, based on whether the user accepts the answer (e.g., the result is within a tolerable limit of errors and/or erasures).

Figure 4:
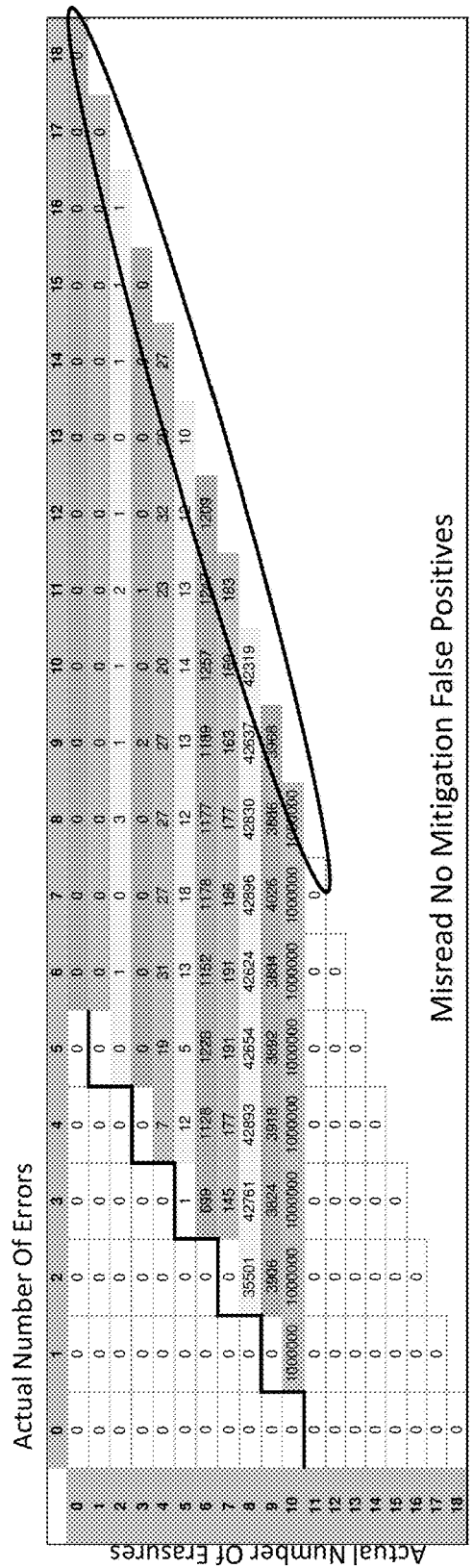
FIG. 4 represents an examination of the misread with no mitigation False Positive matrix in accordance with aspects of the present invention.

FIG. 4 represents a normal phantom testing approach. A phantom barcode is a False Positive detection of a barcode or message. This implies that the decoding software is attempting to decode something that is not a real barcode (or message) and therefore it does not make sense to talk about erasures (known error positions) since there is no truth (original message) to supply that information.

More specifically, in FIG. 4, an examination of the misread with no mitigation False Positive matrix yields the following observation: at a given erasure number, once the combined erasure and error level exceeds the correction capacity by 3 or 4, the False Positive level is constant. This implies that phantom False Positives should exhibit the same characteristics and be able to be mitigated in the same ways as misread False Positives. Also, in this testing approach, one set of 10,000,000 per erasure level is generated and, as before, the data characters were generated randomly. (It should be understood by those of skill in the art that one set of 10,000,000 per erasure level is only one illustrative example, and that other sets per erasure level can also be used.) Unlike misreads, though, the parity characters were generated randomly. This means that each parity character has a 255 of 256 chance of being in error.

Figure 5A:
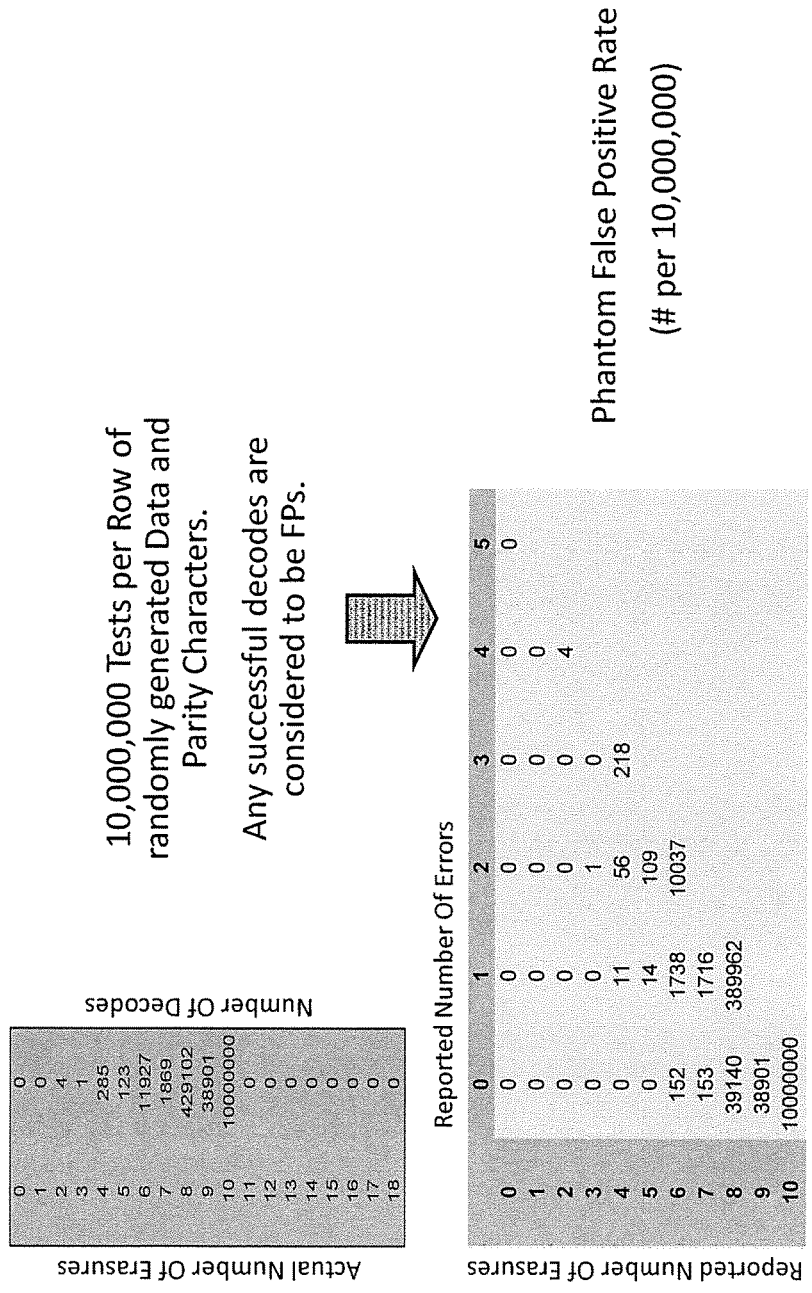
FIG. 5A shows False Positives with normal phantom testing results.

Each of the 10,000,000 will have decoding attempted and any successful decodes will be considered False Positives, as shown in FIG. 5A, for example. By way of an illustrative, non-limiting example, FIG. 5A shows False Positives with normal phantom testing results. As shown in this illustrative non-limiting example, each of the 10,000,000 tests per row will have decoding attempted and any successful decodes will be considered False Positives.

Figure 5B:
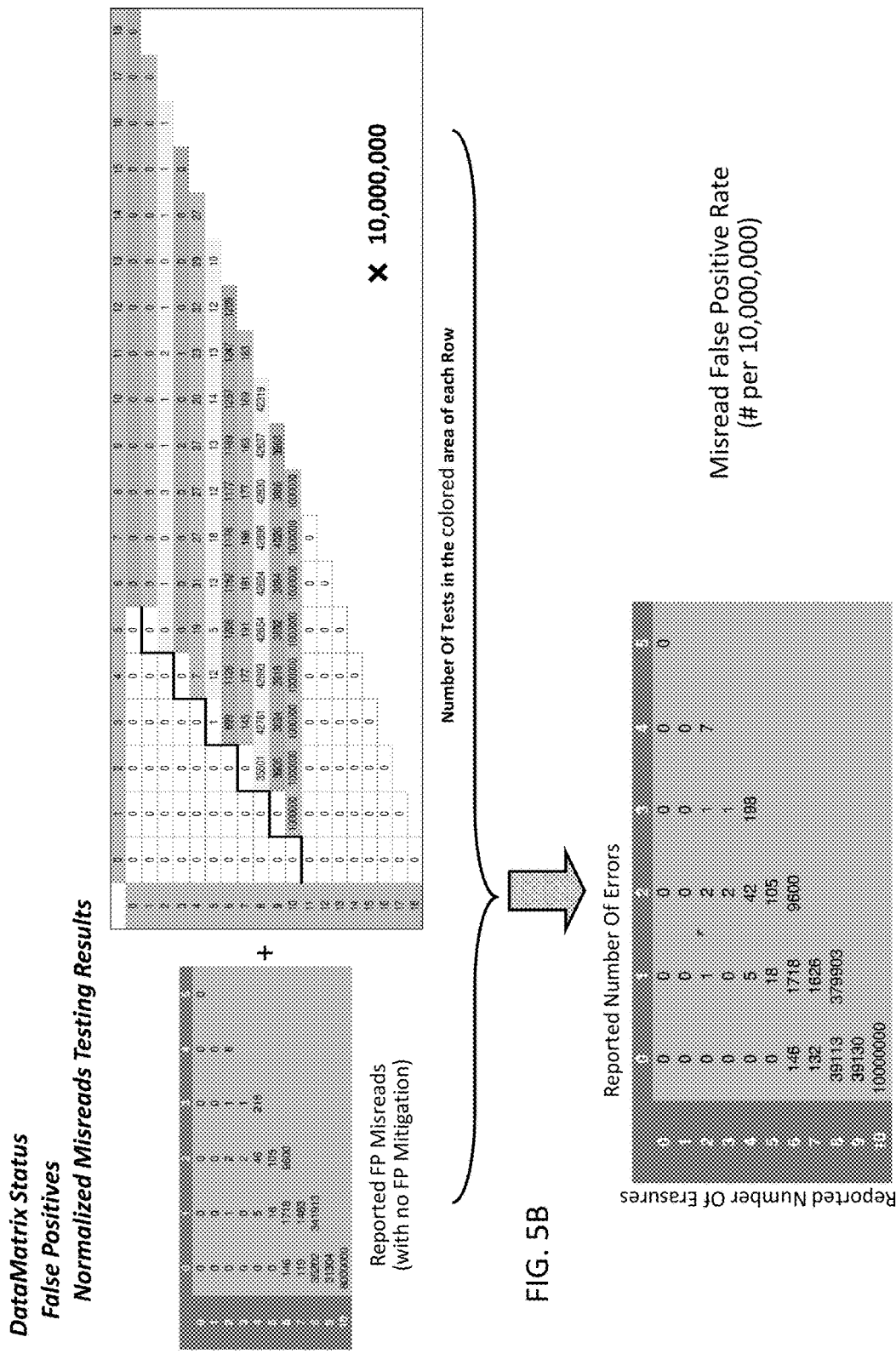
FIG. 5B shows normalized misreads testing results.
Figure 5C:
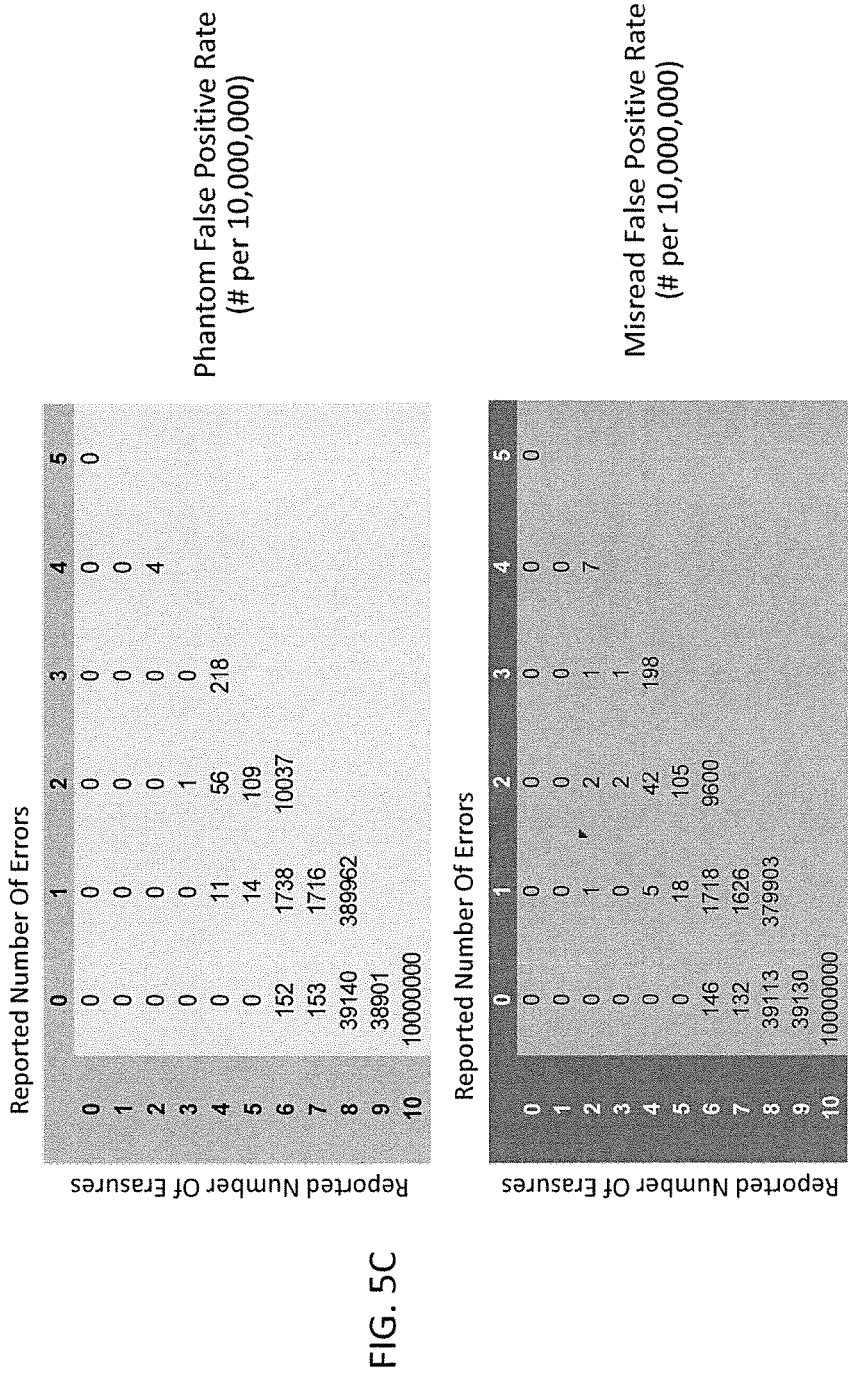
FIG. 5C shows a comparison of test results for a phantom and misread False Positive rate (# per 10,000,000).

FIG. 5B shows normalized misreads testing results. In this illustrative non-limiting example, there is a misread False Positive rate per 10,000,000, as shown in the bottom matrix. FIG. 5C shows a comparison of test results for a phantom and misread False Positive rate (# per 10,000,000). It should be understood by those of skill in the art, that other examples can also be used in implementing the approaches of the present invention. As an improved mitigation approach, it is also possible to use erasures as a means of reading more DMs. Therefore, it is possible to use all locations in the matrix, which will deal with the possibilities of False Positives. This approach will be to keep an array for each size DM that shows the likelihood of an error at each array cell. The user can pass an acceptable error level into decoding software. The decoding software will use the array, the user's input, and the RS Correction Information (Reported Number of Erasures and Report Number of Errors) to determine whether to accept the answer. See, e.g., FIG. 6.

Figure 6:
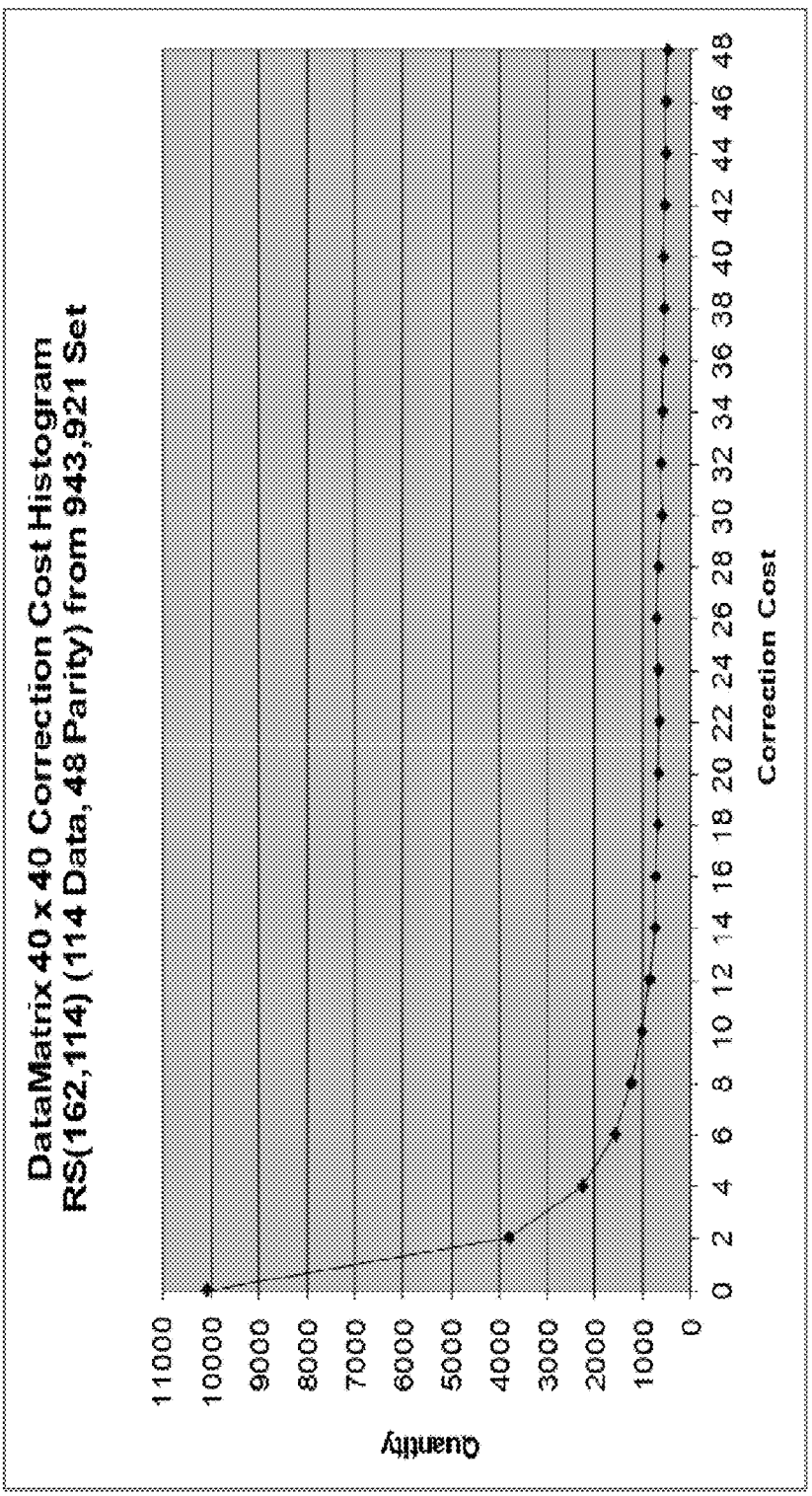
FIG. 6 is a histogram showing quantity vs. RS (Reed Solomon) correction cost.

FIG. 6 is a histogram showing quantity vs. RS (Reed Solomon) correction cost. More specifically, in FIG. 6, the y-axis represents quantity and the x-axis represents RS correction cost for a 40×40 matrix array. As it can be seen from this graph, the smaller the quantity of acceptable errors, the higher the RS correction cost. For example, as shown in FIG. 6, the Maximum Correction Cost: $48<=(2\times Errors)+Erasures$.

Keeping in mind the representative results of FIG. 6, it is anticipated that erasures will be used as a means of reading more DMs and, therefore, all locations in the matrix will be used thus increasing the possibilities of False Positives. The approach described herein, though, will be able to keep an array for each size DM that shows the likelihood of an error at each array cell. The user can then pass an acceptable error level into a known decoder, e.g., infrastructure shown in FIG. 8. The decoder will use the array, the user's input, and the RS Correction Information (e.g., reported number of erasures and reported number of errors) to determine whether to accept the answer.

Figure 7A:
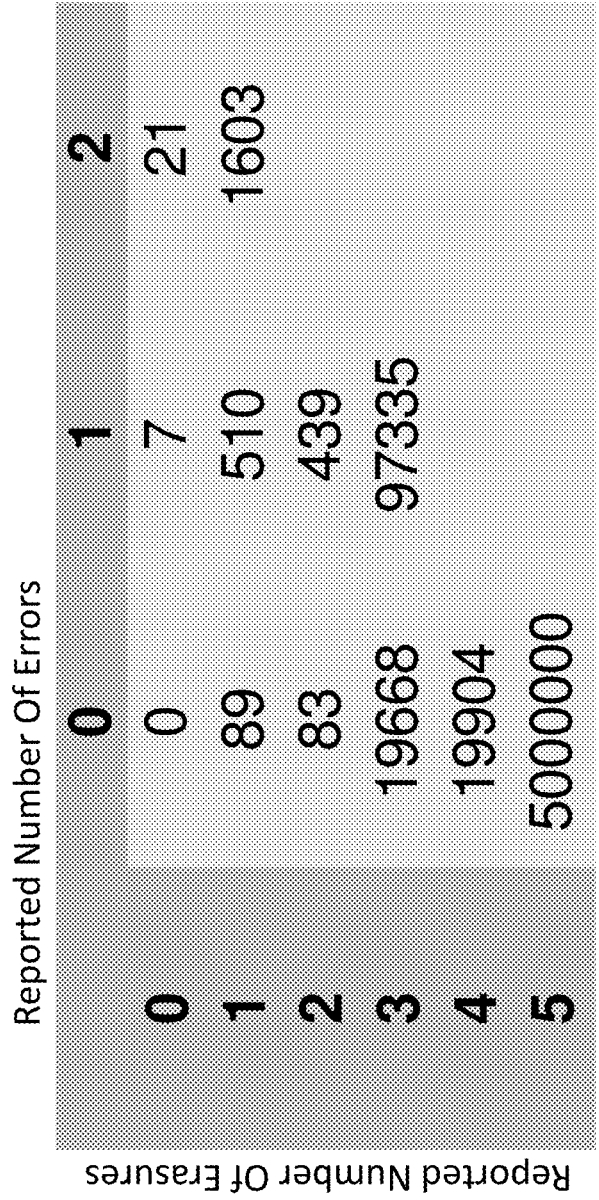
Figure 7B:
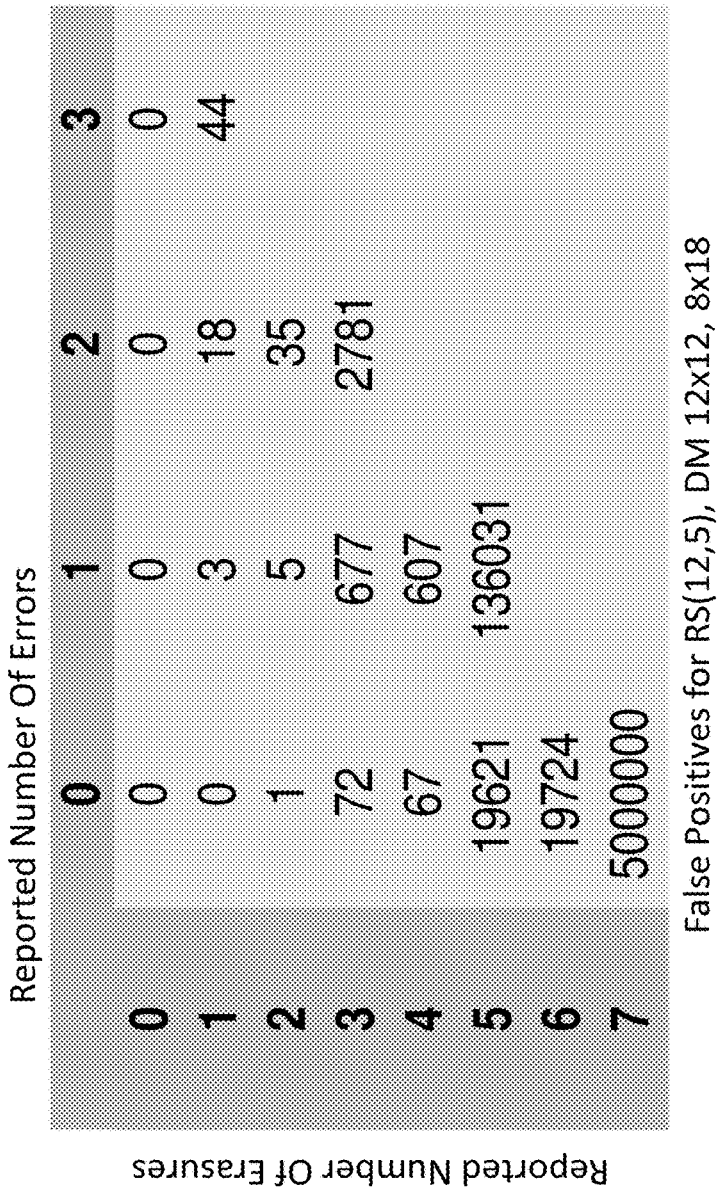
Figure 7C:
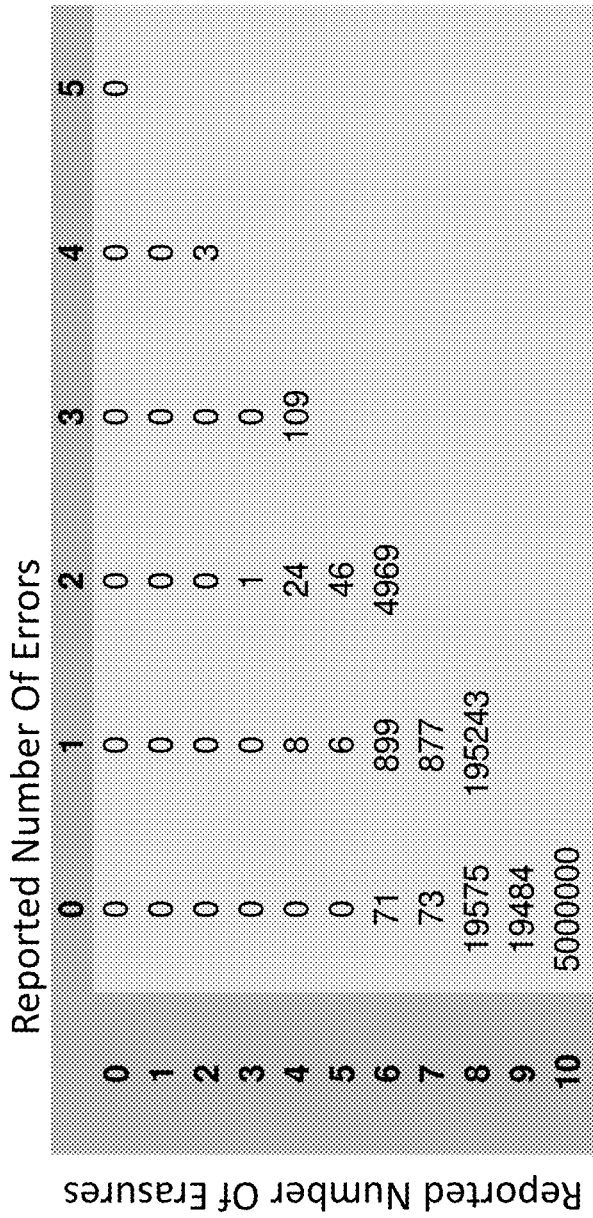

FIGS. 7A-7D show matrices representing a number of False Positives based on a reported number of erasures and errors, in accordance with aspects of the invention. Similar matrices can be completed using the approaches described herein in accordance with aspects of the present invention. FIG. 7A shows a 10×10 matrix using common mitigation data collection. FIG. 7B shows an 18×18 matrix using common mitigation data collection. FIG. 7C shows a 14×14 matrix using common mitigation data collection. FIG. 7D shows a 104×104 matrix using common mitigation data collection. Each of these different approaches are representative of using a relative correction cost limit for different matrices, rows and columns (e.g., $(2\times Errors)+Erasures<=N$) based on a tolerance level of a user. Accordingly, by using the test results described herein, the user can now select a variable correction cost depending on the number of erasures and errors which can be tolerated by the user, as shown by the comparison in FIG. 3A.

System Environment

The present invention may be embodied as a system, method or computer program product. The present invention may take the form of a hardware embodiment, a software embodiment or a combination of software and hardware. Furthermore, the present invention may take the form of a computer program product embodied in any tangible storage having computer-usable program code embodied in the medium (non-transitory medium). The computer-usable or computer-readable storage medium is not a transitory signal per se, and may be any medium that stores information for use by or in connection with the instruction execution system, apparatus, or device. The computer-usable or computer-readable storage medium is any non-transitory medium, for example, an electronic, magnetic, optical, electromagnetic, infrared, or semiconductor system, apparatus, or device. More specific examples of the computer readable storage medium, memory or device would include the following non-transitory examples: an electrical connection having one or more wires, a portable computer diskette, a hard disk, a random access memory (RAM), a read-only memory (ROM),an erasable programmable read-only memory (EPROM or Flash memory), an optical fiber, a portable compact disc read-only memory (CD-ROM), an optical storage device, a magnetic storage device, or any suitable combination of the foregoing.

Figure 8:
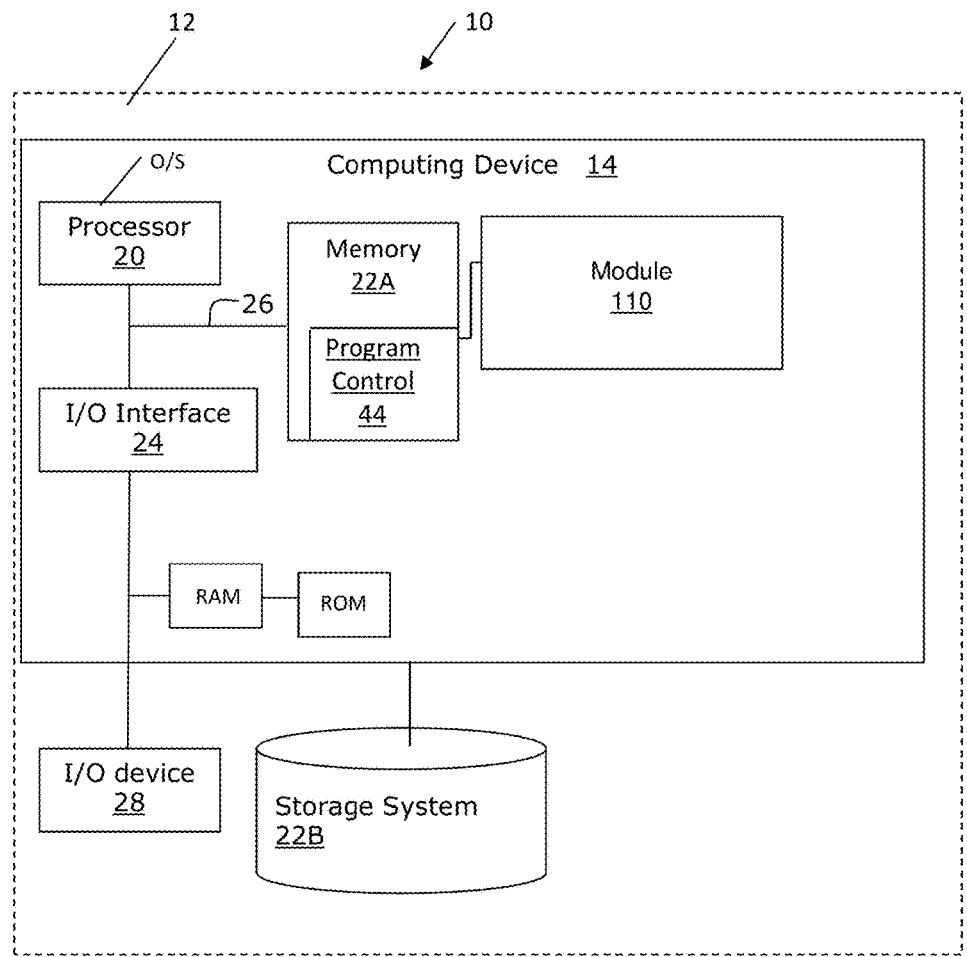
FIG. 8 shows an illustrative environment for implementing the steps in accordance with aspects of the invention.

FIG. 8 shows an illustrative environment 10 for managing the processes in accordance with the invention. The environment 10 includes a server or other computing system 12 that can perform the processes described herein. In embodiments, the illustrative environment may be used in a mail sorting and sequencing system, as shown illustratively in FIG. 10; although other sorting and sequencing systems are also contemplated by the present invention. The computing system 12 includes a computing device 14 which can be resident on or communicate with a network infrastructure or other computing devices. In embodiments, the computing system 12 can be used for maximizing read performance of error detection code and, more particularly, for maximizing read performance of Reed Solomon Based code.

The computing device 14 includes a processor 20, memory 22A, an I/O interface 24, and a bus 26. In addition, the computing device includes random access memory (RAM), a read-only memory (ROM), and an operating system (O/S). The computing device 14 is in communication with an external I/O device/resource 28 and the storage system 22B. The I/O device 28 can comprise any device that enables an individual to interact with the computing device 14 (e.g., user interface) or any device that enables the computing device 14 to communicate with one or more other computing devices using any type of communications link or any device that enables the computing device 14 to interact with is environment. By way of example, the I/O device 28 can be a barcode scanning device or other optical reading device, for reading barcodes, implementing RS error correction processes.

The processor 20 executes computer program code (e.g., program control 44), which can be stored in the memory 22A and/or storage system 22B. While executing the computer program code, the processor 20 can read and/or write data to/from memory 22A, storage system 22B, and/or I/O interface 24. The program code 44 executes the processes of the invention such as, for example, providing collected Reed Solomon correction information so as to allow a user to select different threshold limits for different combinations of errors/erasures.

More specifically, according to a first solution each reported number of errors case can have an optimized threshold just for each case. On the other hand, the program code 44 can also provide an independent threshold for each case (row, column), such that the data can be used for dynamic decisions, e.g., the user's threshold may change from decision to decision. In embodiments, the program code 44 can implement a decoding operation, where the user can pass an acceptable error level into the decoder. The decoder, in turn, will use the array, the user's input, and the RS Correction Information (e.g., reported number of erasures and reported number of errors) to determine whether to accept a particular answer, e.g., correction cost for a particular dynamically adjusted threshold.

As discussed herein, by making such determination it is now possible to use dynamically determined thresholds for maximizing read performance of error detection code. More particularly, by making such dynamic determination it is now possible to maximize read performance of Reed Solomon Based code. In embodiments, the use of dynamically determined thresholds are provided in response to the user's request for a maximum False Positive error rate, which threshold can be based on a reported number of errors and erasures. In embodiments, the dynamically determined thresholds will reduce False Positives and False Negatives, regardless of collection capacity.

The computing device 14 includes a confusion avoidance module 110, which can be implemented as one or more program code in the program control 44 stored in memory 22A as a separate or combined module. Additionally, the confusion avoidance module 110 may be implemented as separate dedicated processors or a single or several processors to provide the functionality of this tool. Moreover, it should be understood by those of ordinary skill in the art that the confusion avoidance module 110 is used as a general descriptive term for providing the features and/or functions of the present invention, and that the confusion avoidance module 110 may comprise many different components such as, for example, the components and/or infrastructure described and shown with reference to FIG. 8.

Figure 9:
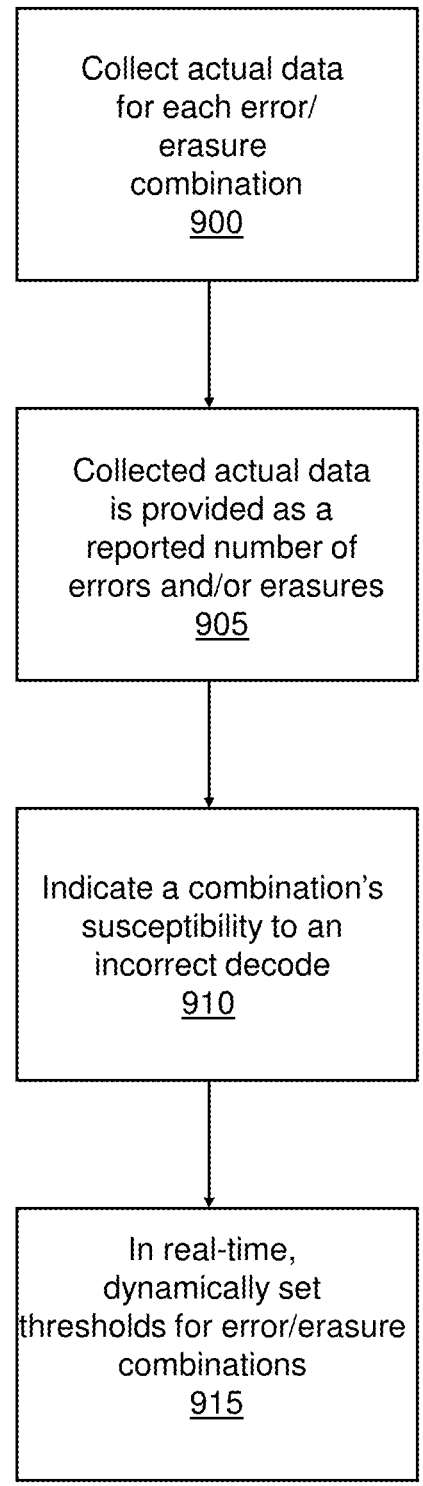
FIG. 9 depicts an exemplary flow for a process in accordance with aspects of the present invention.

FIG. 9 depicts an exemplary flow for a process in accordance with aspects of the present invention. The exemplary flow can be illustrative of a system, a method, and/or a computer program product and related functionality implemented on the computing system of FIG. 8, in accordance with aspects of the present invention. The computer program product may include computer readable program instructions stored on computer readable storage medium (or media). The method, and/or computer program product implementing the flow of FIG. 9 can be downloaded to respective computing/processing devices, e.g., computing system of FIG. 1 as already described herein, or implemented on a cloud infrastructure. Accordingly, the processes associated with each flow of the present invention can be implemented by special purpose hardware-based systems that perform the specified functions or acts or carry out combinations of special purpose hardware and computer instructions.

In particular, at step 900, the process collects actual data for each error/erasure combination in a matrix. At step 905, the collected actual data is provided as a reported number of errors and/or erasures based on the collected actual data. At step 910, specific data for each error/erasure combination is used to indicate a combination's susceptibility to an incorrect decode. At step 915, in real-time, the process dynamically sets thresholds for error/erasure combinations based on a relative correction cost limit for each of the error and/or erasure combinations. In a second solution, each case (row, column) may have an independent threshold, and the underlying data can be used for dynamic decisions, e.g., the user's threshold may change from decision to decision. In embodiments, the data, e.g., multiple thresholds, can be created by building examples, e.g., millions of examples, and collecting the actual decoding results. Accordingly, as previously described, instead of one threshold that covers all cases, each reported number of errors case has an optimized threshold just for each case.

Implementations

Figure 10:
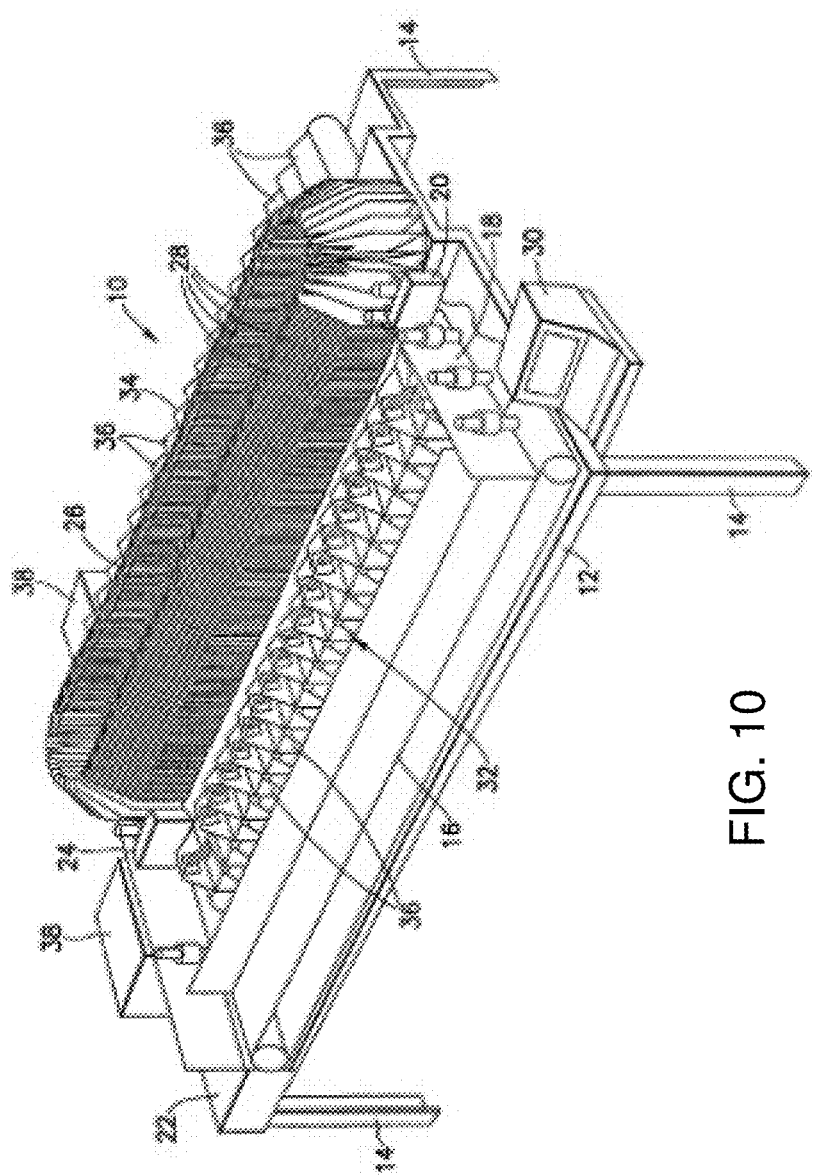
FIG. 10 shows an illustrative mail sorting and sequencing system, which can be used in implementing the processes of the present invention.

FIG. 10 shows an illustrative mail sorting and sequencing system, which can be used with the processes of the present invention. It should be understood by those of skill in the art that the present invention can be implemented with any number of mail sorting and sequencing systems, and that the illustrative representation of the mail sorting and sequencing system of FIG. 10 should not be considered a limiting feature to the claimed invention.

As shown in FIG. 10, the mail sorting and sequencing system is a single pass carrier delivery sequence sorter generally indicated by the numeral 10. The single pass carrier delivery sequence sorter 10 has a base 12 with four legs 14 (only three shown in FIG. 3) extending therefrom. An auto feed station 16 extends lengthwise along the base 12 and has a feeder 18 and an address reader 20 at one end and a manual feed station 22 with a second address reader 24 at the other end. The feeder 18 and address reader 20 create a feed, read and insert path to a racetrack sorting device 26 which has an array of bin dividers 28, adjacent ones of which create holders for individual mail pieces deposited therebetween. A video encoder/numerical controller 30 which may be a microprocessor or the like is located adjacent the feeder 18 and operationally connected to various components of the single pass carrier delivery sequence sorter 10 for coordinating the operation of the same in a manner explained. In embodiments, the address readers 20, 24 and/or video encoder/numerical controller 30 or other computing devices can read barcode information and implement the processes of the present invention. On either side of the racetrack sorting device 26 are two interim unloading station units generally indicated by the numeral 32, each having twenty (20) interim unloading stations 36. At the ends of the interim unloading station units 32, bundling/wrapping stations 38 are mounted on the base 12. See, e.g., U.S. Pat. No. 8,138,438, for a full detailed explanation of the single pass carrier delivery sequence sorter 10 and related systems, the contents of which are incorporated by reference in their entirety herein.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, and combinations thereof such as are within the scope of the appended claims.

What is claimed is:

1. A method implemented in a computing device, comprising:

performing a decoding operation, using a decoder, on a damaged code;

receiving, from the decoder, a reported number of erasures and errors associated with the damaged code;

generating, for a case of the reported number of erasures and errors, a plurality of example messages, including examples representing False Positives;

decoding, using the decoder, the plurality of example messages;

determining, using results of the decoding of the example messages, a susceptibility of the case to an incorrect decode;

dynamically determining a threshold for the case of the reported number of erasures and errors based on the determined susceptibility of the case to the incorrect decode; and determining, using the threshold, whether to accept or reject a result of the decoding operation on the damaged code, wherein the threshold corresponds to a maximum allowable correction cost.

2. The method of claim 1, further comprising:

generating, for each of a plurality of cases of erasures and errors, the plurality of example messages, including the examples representing False Positives; and dynamically determining, for each of the plurality of cases of erasures and errors, the threshold, wherein each of the plurality of cases of erasures and errors has an independent threshold.

3. The method of claim 2, wherein each of the plurality of cases is representative of a row and column of a matrix comprising erasures vs. errors.

4. The method of claim 2, wherein the independent threshold is an adjustable threshold based on a number of required False Positives.

5. The method of claim 1, wherein the threshold is based on a variable correction cost which depends on a number of erasures and errors.

6. The method of claim 1, wherein the threshold is not an absolute number for each case.

7. The method of claim 1, wherein the examples are a collection of actual data for each of the error/erasure combinations which is used in real time to set the threshold to user requirements.

8. The method of claim 1, wherein the method maximizes read performance of Reed Solomon Based code used to decode data matrix symbology.

9. The method of claim 1, wherein the dynamically determining the threshold is determined in response to a user's request for a maximum False Positive error rate.

10. The method of claim 9, wherein the maximum False Positive error rate is dynamic.

11. The method of claim 1, wherein the generating the plurality of example messages comprises, for each message, randomly generating data characters.

12. The method of claim 11, wherein the generating the plurality of example messages further comprises, for each message, generating parity characters based on the randomly generated data characters.

13. The method of claim 12, wherein the generating the plurality of example messages further comprises, for each message, applying to the message a number of erasures determined based on the case and a number of errors determined based on the case.

14. The method of claim 1, wherein the plurality of example messages are barcodes or QR-Codes.

* * * * *